(12) United States Patent  (10) Patent No.: US 7,808,747 B2
Fuji et al.  (45) Date of Patent: Oct. 5, 2010

(54) MAGNETORESISTIVE EFFECT ELEMENT, MAGNETIC HEAD AND MAGNETIC RECORDING/REPRODUCING APPARATUS

(75) Inventors: Yoshihiko Fuji, Kawasaki (JP); Hideaki Fukuzawa, Kawasaki (JP); Hiromi Yuasa, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 912 days.

(21) Appl. No.: 11/702,582

(22) Filed: Feb. 6, 2007

(65) Prior Publication Data

US 2007/0188945 A1    Aug. 16, 2007

(30) Foreign Application Priority Data

Feb. 16, 2006 (JP) .......................... P2006-038977

(51) Int. Cl.
    *G11B 5/39* (2006.01)
(52) U.S. Cl. .................................................. 360/324.1
(58) Field of Classification Search ........................ None
    See application file for complete search history.

(56) References Cited

U.S. PATENT DOCUMENTS

| 6,707,649 | B2 * | 3/2004 | Hasegawa et al. ...... 360/324.12 |
| 6,842,317 | B2 | 1/2005 | Sugita et al. |
| 6,927,952 | B2 * | 8/2005 | Shimizu et al. ........ 360/324.12 |
| 6,937,446 | B2 | 8/2005 | Kamiguchi et al. |
| 7,046,489 | B2 | 5/2006 | Kamiguchi et al. |
| 7,218,484 | B2 | 5/2007 | Hashimoto et al. |
| 7,405,906 | B2 | 7/2008 | Funayama et al. |
| 7,426,098 | B2 * | 9/2008 | Yuasa et al. ............ 360/324.12 |
| 2002/0051380 | A1 * | 5/2002 | Kamiguchi et al. ......... 365/158 |
| 2002/0135956 | A1 | 9/2002 | Hasegawa et al. |
| 2003/0123200 | A1 * | 7/2003 | Nagasaka et al. ........ 360/324.1 |
| 2004/0021990 | A1 * | 2/2004 | Koui et al. ............... 360/324.1 |

(Continued)

FOREIGN PATENT DOCUMENTS

CN    1595676 A    3/2005

(Continued)

OTHER PUBLICATIONS

Yuasa et al., "Output enhancement of spin-valve giant magnetoresistance in current-perpendicular-to-plane geometry", Journal of Applied Physics, vol. 92, No. 5, pp. 2646-2650 (2002).

(Continued)

*Primary Examiner*—Mark Blouin
(74) *Attorney, Agent, or Firm*—Nixon & Vanderhye, PC

(57) ABSTRACT

A magnetoresistive effect element includes a fixed magnetization layer; a free magnetization layer; a nonmagnetic spacer layer between the fixed magnetization layer and the free magnetization layer; and an insertion layer disposed on an opposite side of the free magnetization layer from the nonmagnetic spacer layer, wherein the first insulating layer has an oxide, a nitride, or an oxynitride including at least one kind of element selected from a group constituted of Al (aluminum), Si (silicon), Mg (magnesium), Ta (tantalum) and Zn (zinc) as a major constituent, and the insertion layer has an oxide, a nitride, or an oxynitride including at least one kind of element selected from a group constituted of Al (aluminum), Si (silicon), Mg (magnesium), Ta (tantalum) and Zn (zinc) as a major constituent.

26 Claims, 10 Drawing Sheets

U.S. PATENT DOCUMENTS

| | | |
|---|---|---|
| 2005/0168887 A1* | 8/2005 | Yuasa et al. ............ 360/324.12 |
| 2005/0201020 A1 | 9/2005 | Fuke et al. |
| 2006/0034022 A1* | 2/2006 | Fukuzawa et al. ........ 360/324.1 |
| 2006/0050444 A1* | 3/2006 | Fukuzawa et al. ........... 360/324 |
| 2006/0077596 A1* | 4/2006 | Yuasa et al. .............. 360/324.1 |
| 2006/0164764 A1 | 7/2006 | Kamiguchi et al. |
| 2006/0181814 A1* | 8/2006 | Koui et al. ............... 360/324.1 |
| 2007/0259213 A1 | 11/2007 | Hashimoto et al. |
| 2008/0106825 A1 | 5/2008 | Funayama et al. |
| 2008/0106826 A1 | 5/2008 | Funayama et al. |

FOREIGN PATENT DOCUMENTS

| | | |
|---|---|---|
| CN | 1674094 A | 9/2005 |
| JP | 2002-208744 | 7/2002 |
| JP | 2003-008108 | 1/2003 |
| JP | 2004-153248 | 5/2004 |
| JP | 2005-086112 | 3/2005 |
| JP | 2005-259976 | 9/2005 |

OTHER PUBLICATIONS

Yuasa et al., "Effect of inserted Cu on current-perpendicular-to-plane-giant magnetoresistance of $Fe_{50}Co_{50}$ spin valves", Journal of Applied Physics, vol. 93, No. 10, pp. 7915-7917 (2003).

Fukuzawa et al., "Large magnetoresistance ratio of 10% by $Fe_{50}Co_{50}$ layers for current-confined-path current-perpendicular-to-plane giant magnetoresistance spin-valve films" Applied Physics Letters, vol. 87, pp. 082507-1 to 082507-3 (2005).

First Office Action issued on Aug. 29, 2008, in Chinese Patent Application No. 200710078832.5 and English-language translation thereof.

* cited by examiner

MAGNETORESISTIVE EFFECT ELEMENT, MAGNETIC HEAD AND MAGNETIC RECORDING/REPRODUCING APPARATUS

CROSS-REFERENCE TO THE INVENTION

This application is based upon and claims the benefit of priority from the prior Japanese Patent Application No. 2006-038977, filed on Feb. 16, 2006; the entire contents of which are incorporated herein by reference.

BACKGROUND OF THE INVENTION

1. Field of the Invention

The present invention relates to a magnetoresistive effect element which detects magnetism by passing a sense current in a direction perpendicular to a film plane of a magnetoresistive effect film, a magnetic head and a magnetic recording/reproducing apparatus.

2. Description of the Related Art

In recent years, hard disk drives (HDDS) have rapidly moved to downsizing and high densities, and are still expected to be higher in density hereafter. High densification of HDD can be realized by increasing the track density by narrowing the recording track width. However, if the track width becomes narrow, intensity of recorded magnetization, namely, a recording signal becomes small, and it is necessary to enhance reproducing sensitivity of an MR head which reproduces a medium signal.

Recently, a GMR head including a highly sensitive spin-valve film using a giant magneto-resistance effect (GMR) has been adopted. The spin-valve film (also called "a spin-dependent scattering unit") is a multi-layered film having a sandwich structure sandwiching a nonmagnetic spacer layer between two ferromagnetic layers. A magnetization direction of one ferromagnetic layer (called "a pinned layer" or "fixed magnetization layer") of the two ferromagnetic layers is fixed with an antiferromagnetic layer or the like. A magnetization direction of the other ferromagnetic layer (called "a free layer" or "a free magnetization layer") is changeable in accordance with an external magnetic field. In the spin-valve film, a large magnetoresistive effect is obtained by a change in a relative angle of the magnetization directions of the two ferromagnetic layers.

A GMR head of a conventional spin-valve film has a CIP (Current in plane) structure which passes a sense current parallel with a film plane (CIP-GMR element). On the other hand, a GMR element of a CPP (Current Perpendicular to Plane) structure (CPP-GMR element) which passes a sense current perpendicularly to a film plane attracts attention since it has a larger GMR effect than the CIP-GMR element.

However, in the case of a spin-valve film structure which is the highest in realizability as a device, the total film thickness of the pinned layer/the nonmagnetic spacer layer/the free layer (spin-dependent scattering unit) which are the layers dependent on spin is very thin, with the small number of interfaces, and therefore, the element resistance when a current is passed perpendicularly in the CPP-GMR element is very small. As a result, the obtained resistance change amount, namely, output is small, though the magnetoresistive effect itself is gigantic. In order to put the CPP-GMR element of the spin-valve film structure into practice, it is important to increase the resistance value of the spin-dependent scattering unit and make the resistance change amount large. Further, it is important to use a material with a large spin-dependent scattering effect for the magnetic material of the pinned layer and the free layer.

It is confirmed that in the metal CPP-GMR element in which all of the pinned layer/the nonmagnetic spacer layer/the free layer (spin-dependent scattering unit) are composed of metal, the spin-dependent interface scattering effect increases by changing the magnetic material of the free layer and the pinned layer to $Fe_{50}Co_{50}$ of the bcc structure from the conventional $Co_{10}Fe_{10}$ of the fcc structure, and the spin-dependent bulk scattering effect increases by inserting a extra thin Cu into the magnetic layer. (See, for example, J. Appl. Phys., 92, 2646 (2002), J. Appl. Phys., 93, 7915 (2003)). However The values of the resistance change amount dRA and MR rate of change are still insufficient with respect to the performance required at 200 Gbpsi or more.

Meanwhile, in order to increase the resistance value of the spin-dependent scattering unit of the CPP-GMR element, a CPP-GMR element in which an oxide layer (NOL: Nano Oxide Layer) including a current path (CCP: Current-Confined-Path) in a direction perpendicular to film plane is used for a nonmagnetic spacer layer is proposed (see, for example, JP-A 2002-208744 (KOKAI)). Such an element will be called a CCP-CPP element hereinafter. In the CCP-CPP element, the resistance value of the spin-dependent scattering unit is increased and the resistance change amount can be increased, by the current-confined-path effect of passing a current into only a current path portion, and passing no current to the other portions.

In the CCP-GMR element, the ratio of the CCP-NOL portion is high in the total resistance when a current is passed perpendicularly, and therefore, the area resistance RA and the resistance change amount RA of the CCP-GMR element are determined substantially in the vicinity of the CCP-NOL spacer. Therefore, of the spin-dependent scattering, the interface scattering effect has a larger influence than the bulk scattering effect. Namely, in the CCP-CPP element, it is effective for realizing a high MR change of rate to use a material having a large spin-dependent interface scattering effect as the magnetic layer material of the free layer and the pinned layer.

By using $Fe_{50}Co_{50}$ of the bcc structure, which has been already confirmed to have a large spin-dependent interface scattering effect in the metal CCP-CPP element, as the magnetic layer of the free layer and the pinned layer of the CCP-CPP element, high resistance change amount and MR rate of change are confirmed (see Appl. Phys. Lett., 87, 082507 (2005)).

The art of suppressing and restoring deterioration of crystallinity by providing a cap layer composed of an element with a large distance between atoms in the closest proximity on the free layer is disclosed (see JP-A 2005-259976 (KOKAI)). In the aforementioned JP-A 2002-208744 (KOKAI), the art of providing a resistance control layer in at least any one of the pinned layer, the free layer and the nonmagnetic intermediate layer is disclosed.

SUMMARY OF THE INVENTION

Here, it is desired to enhance reliability of a magnetoresistive effect element. For example, variation with time of the MR rate of change by passing a sense current to the magnetoresistive effect element is desired to be small.

In view of the above description, an object of the present invention is to provide a magnetoresistive effect element which is designed to reduce variation with time of an MR rate of change by passing a sense current, and a manufacturing method thereof.

A magnetoresistive effect element according to a first mode includes a fixed magnetization layer of which magnetization direction is practically fixed in one direction; a free magnetization layer of which magnetization direction changes with respect to an external magnetic field; a nonmagnetic spacer layer that is disposed between the fixed magnetization layer and the free magnetization layer, and includes a first insulating layer, and a first current path which penetrates through the first insulating layer; and an insertion layer which is disposed on an opposite side of the free magnetization layer from the nonmagnetic spacer layer, wherein the first insulating layer has an oxide, a nitride, or an oxynitride including at least one kind of element selected from a group constituted of Al (aluminum), Si (silicon), Mg (magnesium), Ta (tantalum) and Zn (zinc) as a major constituent, and the insertion layer has an oxide, a nitride, or an oxynitride including at least one kind of element selected from a group constituted of Al (aluminum), Si (silicon), Mg (magnesium), Ta (tantalum) and Zn (zinc) as a major constituent.

A magnetoresistive effect element according to a second mode includes a fixed magnetization layer of which magnetization direction is practically fixed in one direction; a free magnetization layer of which magnetization direction changes with respect to an external magnetic field; a nonmagnetic, spacer layer that is disposed between the fixed magnetization layer and the free magnetization layer, and includes a first insulating layer, and a first current path which penetrates through the first insulating layer; and an insertion layer which is disposed on an opposite side of the free magnetization layer from the nonmagnetic spacer layer, wherein the first insulating layer has an oxide, a nitride, or an oxynitride, which includes Ti (titanium), as a major constituent, and the insertion layer has an oxide, a nitride, or an oxynitride, which includes Ti (titanium), as a major constituent.

A magnetoresistive effect element according to a third mode includes a fixed magnetization layer of which magnetization direction is practically fixed in one direction; a free magnetization layer of which magnetization direction changes with respect to an external magnetic field; a nonmagnetic insulating spacer layer that is disposed between the fixed magnetization layer and the free magnetization layer; a current confining layer which is inserted into, the free magnetization layer, and includes a first insulating layer, and a first current path penetrating through the first insulating layer; and an insertion layer which is disposed on an opposite side of the free magnetization layer from the nonmagnetic insulating spacer layer, wherein the first insulating layer has an oxide, a nitride, or an oxynitride including at least one kind of element selected from a group constituted of Al (aluminum), Si (silicon), Mg (magnesium), Ta (tantalum) and Zn (zinc), as a major constituent, and the insertion layer has an oxide, a nitride, or an oxynitride including at least one kind of element selected from a group constituted of Al (aluminum), Si (silicon), Mg (magnesium), Ta (tantalum) and Zn (zinc), as a major constituent.

A magnetoresistive effect element according to a fourth mode includes a fixed magnetization layer of which magnetization direction is practically fixed in one direction; a free magnetization layer of which magnetization direction changes with respect to an external magnetic field; a nonmagnetic insulating spacer layer that is disposed between the fixed magnetization layer and the free magnetization layer; a current confining layer which is inserted into the free magnetization layer, and includes a first insulating layer, and a first current path penetrating through the first insulating layer; and an insertion layer which is disposed on an opposite side of the free magnetization layer from the nonmagnetic insulating spacer layer, wherein the first insulating layer has an oxide, a nitride, or an oxynitride, which includes Ti (titanium), as a major constituent, and the insertion layer has an oxide, a nitride, or an oxynitride, which includes Ti (titanium), as a major constituent.

DESCRIPTION OF THE EMBODIMENTS

First Embodiment

Embodiments of the present invention will now be described with reference to the drawings.

Figure 1:
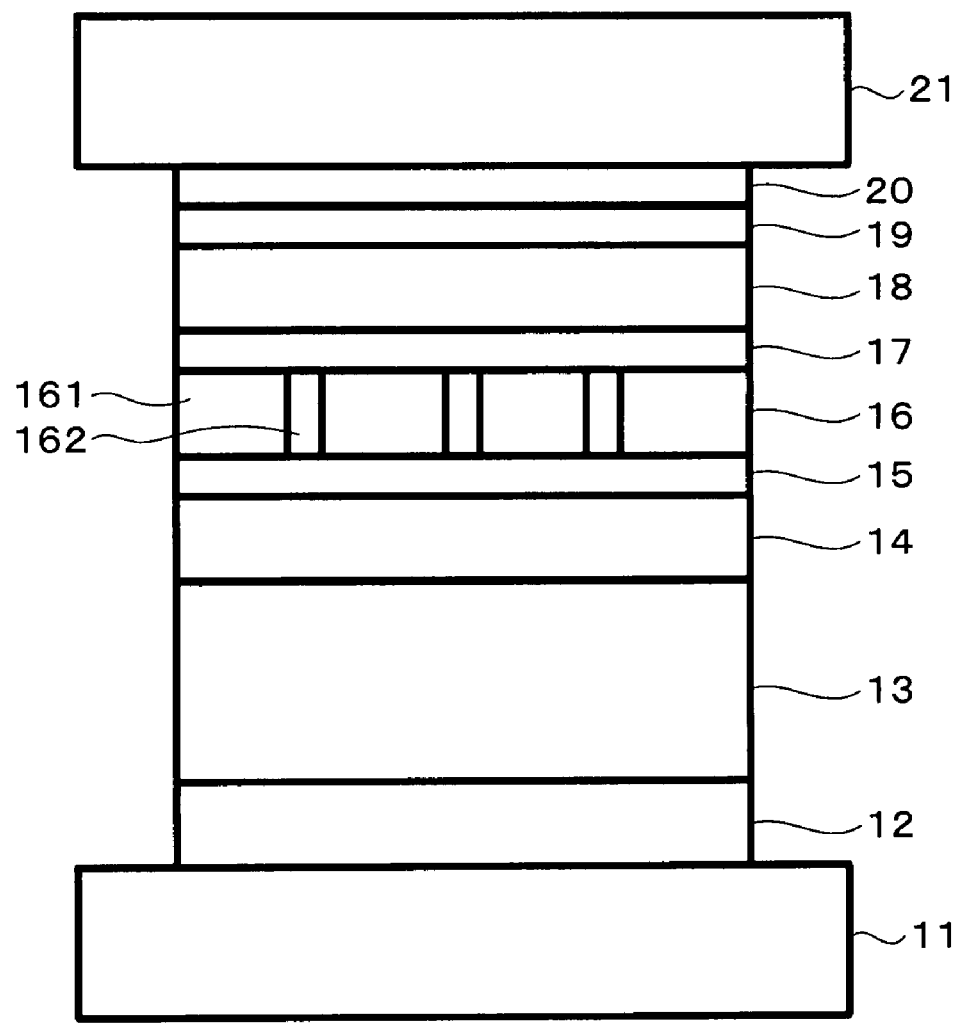
FIG. 1 is a sectional view showing a section of a magnetoresistive effect element according to a first embodiment.

FIG. 1 is a sectional view showing a section of a magnetoresistive effect element (CCP-CPP element) according to a first embodiment. The magnetoresistive effect element shown in FIG. 1 has a lower electrode 11, a foundation layer 12, a pinning layer 13, a pinned layer 14, a metal layer 15, a spacer layer (CCP-NOL) 16, a metal layer 17, a free layer 18, a thin film insertion layer 19, a cap layer 20 and an upper electrode 21, which are formed on a substrate. Among them, the pinned layer 14, the spacer layer 16 and the free layer 18 correspond to a spin-valve film (spin-dependent scattering unit) formed by sandwiching the nonmagnetic spacer layer 16 between two ferromagnetic layers. The spacer layer 16 includes an insulating layer 161 and a current path 162 which penetrates through the insulating layer 161.

In this embodiment, the thin film insertion layer 19 is provided between the free layer 18 and the cap layer 20, so that even when current energization for a long time is conducted, reduction in MR rate of change of the magnetoresistive effect element does not occur.

The components of the magnetoresistive effect element will be described hereinafter.

The lower electrode 11 is an electrode for passing a current in the direction perpendicular to the spin-valve film. Voltage is applied between the lower electrode 11 and the upper electrode 21, and thereby, a current passes through the inside of the spin-valve film along the direction perpendicular to the film. By detecting the change in resistance caused by the magnetoresistive effect by the current, detection of magnetism becomes possible.

The foundation layer 12 can be divided into, for example, a buffer layer 12a and a seed layer 12b. The buffer layer 12a is a layer for relieving roughness of the surface of the lower electrode 11. The seed layer 12b is a layer for controlling crystal orientation and crystal grain size of the spin-valve film deposited thereon.

The pinning layer 13 has the function of applying unidirectional anisotropy to the ferromagnetic layer to be the pinned layer 14 which is deposited thereon to fix magnetization. As the material of the pinning layer 13, antiferromagnetic materials can be used.

The pinned layer 14 can be made a synthetic pinned layer composed of a lower pinned layer 141, a magnetic coupling intermediate layer 142, and an upper pinned layer 143. The pinning layer 13 and the lower pinned layer 141 directly thereon are exchange-magnetism coupled to have unidirectional anisotropy. The lower pinned layer 141 and the upper pinned layer 143 under and on the magnetic coupling intermediate layer 142 are magnetically coupled strongly to each other so that the directions of magnetization become antiparallel with each other.

The magnetic coupling intermediate layer 142 has the function of causing antiferromagnetic coupling to the magnetic layers on and under it (the lower pinned layer 141 and the upper pinned layer 143) to form a synthetic pin structure.

The upper pinned layer 143 is a magnetic layer which forms part of the spin-dependent scattering unit and directly contributes to the MR effect.

The metal layer 15 is used for formation of a current path 162 and is a so-called supply source of the current path 162. However, the metal layer 15 does not have to remain as a definite metal layer after formation of the current path 162.

The spacer layer (CCP-NOL) 16 has the insulating layer 161 and a current path 162. The spacer layer 16, the metal layer 15 and the metal layer 17 can be all treated as the spacer layer 16.

The insulating layer 161 is composed of an oxide, a nitride, an oxynitride or the like. As the insulating layer 161; both the amorphous structure such as $Al_2O_3$ and the crystal structure such as MgO can be adopted.

The current path 162 is for confining a current, and functions as a conductor for passing a current in the layer direction of the insulating layer 161, and can be composed of a nonmagnetic metal such as Cu or the like, for example. Namely, the spacer layer 16 has a current-confined-path structure (CCP structure), and is capable of increasing the element resistance and the MR rate of change by the current-confined-path effect.

The upper metal layer 17 has the function as the barrier layer which protects the free layer 18 deposited thereon from being oxidized by being in contact with the oxide of the spacer layer 16, and the function of making crystallinity of the free layer 18 favorable.

Depending on the material of the spacer layer 16 and the material of the free layer 18, the upper metal layer 17 may not necessarily provided. By optimization of the annealing condition, selection of the material of the insulating layer 161 of the spacer layer 16, the material of the free layer 18 and the like, deterioration of crystallinity can be avoided, and the metal layer 17 on the spacer layer 16 can be made unnecessary.

However, considering a margin in manufacture, it is preferable to form the metal layer 17 on the spacer layer 16.

The free layer 18 is the layer having a ferromagnetic substance of which magnetization direction changes in accordance with an external magnetic field.

The cap layer 20 has the function of protecting the spin-valve film.

The upper electrode 21 is an electrode for passing a current in the direction perpendicular to the spin-valve film. Voltage is applied between the lower electrode 11 and the upper electrode 21, whereby the current in the direction perpendicular to the spin-valve film passes into the inside of the spin-valve film.

(Thin Film Insertion Layer 19)

The details of the thin film insertion layer 19 will be described hereinafter. The thin film insertion layer 19 is to control stress inside the spin-valve film, and to prevent the spin-valve film from being deteriorated by the internal stress.

A. Deterioration of Magnetoresistive Effect Element by Stress

The mechanism of deterioration of the spin-valve film by stress will be described.

In the CCP-CPP spin-valve film, the spacer layer 16 is inserted into a stacked film of a number of thin metal films. The spacer layer 16 includes the insulating layer 161 composed of, for example, an oxide. An insulator of an oxide or the like generally has larger stress than that of metal. Therefore, in the CCP-CPP spin-valve film, the metal layer 17 adjacent to the spacer layer 16 receives larger stress than its own internal stress from the spacer layer 16. Namely, the region in the vicinity of the metal layer 17 adjacent to the spacer layer 16 is in an unstable state with large stress distribution.

By current energization to the magnetoresistive effect element (CCP-CPP element), heat generation in accordance with the Joule's law occurs. At this time, the temperature increase value of the heat is proportional to the product of the applied voltage and the current. In the CCP-CPP element, the ratio of the resistance of the spacer layer 16 with respect to the total resistance is large, and therefore, applied voltage is substantially added to the spacer layer 16. A current is confined in the spacer layer 16, and therefore, the local current density in the current path 162 becomes very high. Namely, the current path 162 in the CCP-CPP spin-valve film is at a high voltage and high current density, and Joule heat is expected to occur locally.

When heat generation occurs in the vicinity of the spacer layer 16 due to current energization, mobility of atoms in the vicinity thereof is enhanced, and migration of atoms in accordance with the internal stress occurs. Here, in the metal layer 17 adjacent to the spacer layer 16, stress distribution is large, and therefore, distribution occurs to the migration length of atoms. As a result, there arises the possibility of occurrence of lattice mismatch, mixing of atoms, and increase in roughness in the interface of the spacer layer 16 and the adjacent metal layer 17. These phenomena cause reduction in the spin-dependent interface scattering effect.

As described above, in the CCP-CPP element, the ratio of the resistance in the vicinity of the spacer layer 16 with respect to the total resistance is large. Therefore, contribution which the spin-dependent interface scattering in the vicinity of the spacer layer 16 gives to the MR rate of change is large. Namely, there is the possibility that deterioration of the interface structure in the vicinity of the spacer layer 16 directly connects to deterioration of the MR rate of change.

B. Control of Stress by the Thin Film Insertion Layer 19

In order to describe effectiveness of the thin film insertion layer 19, difference in internal stress of the CCP-CPP spin-valve films with and without the thin film insertion layer 19 will be shown.

(1) The Case without Providing the Thin Film Insertion Layer 19

Figure 2:
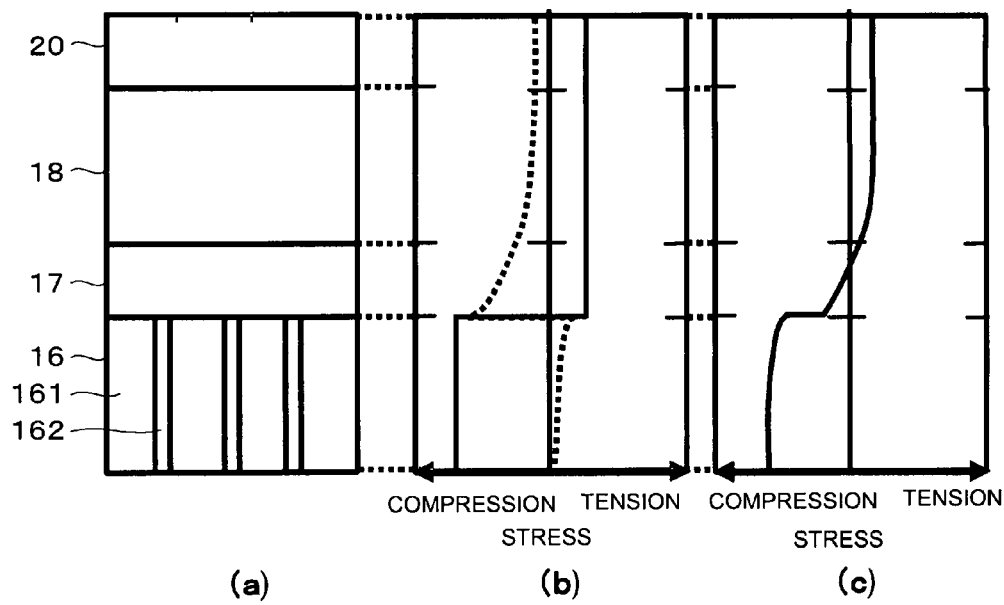
FIG. 2 is a conceptual diagram showing an internal stress of a CCP-CPP spin-valve film which is not provided with a thin film insertion layer.

FIG. 2 is a conceptual diagram showing internal stress of a CCP-CPP spin-valve film which is not provided with the thin film insertion layer 19. (a) in FIG. 2 shows a section of the spacer layer 16 to the cap layer 20. (b) in FIG. 2 shows internal stress (solid line) peculiar to the material in each of the spacer layer 16 to the cap layer 20, and stress (broken line) which each of the layers receives from the adjacent layer. (c) in FIG. 2 shows actual internal stress in each of the spacer layer 16 to the cap layer 20. Here, the vertical axes of (b) and (c) of FIG. 2 correspond to the sectional view of the CCP-CCP element of (a). In FIG. 2, the spacer layer 16 having compression stress is taken as an example.

As shown by the solid line in (b) of FIG. 2, the spacer layer 16 has compression stress, and the metal layers thereon (the metal layer 17, the free layer 18, the cap layer 20) have weak tensile stress. As shown by the broken line in (c) in FIG. 2, the spacer layer 16 and the metal layers thereon receive stresses, which the adjacent layers respectively have, as external stresses due to action and reaction by the stresses peculiar to their own materials. Therefore, the stress in the CCP-CPP spin-valve film is actually the sum of the solid line and the broken line in (b) of FIG. 2, and is shown in (c) in FIG. 2.

As shown in (c) in FIG. 2, the value of the internal stress abruptly changes from the interface of the spacer layer 16 and the metal layer 17 to the free layer 18. As described above, the abrupt change (distribution) of the internal stress causes reduction in spin-dependent interface scattering effect such as lattice mismatch, mixing of atoms, and increase in roughness on the occasion of migration of atoms by heat generation at the time of current energization.

(2) The Case Provided with the Thin Film Insertion Layer 19

In this embodiment, the thin film insertion layer 19 is provided between the free layer 18 and the cap layer 20 as shown in FIG. 1. As the thin film insertion layer 19, the material that has a stress of the same polarity as the internal stress peculiar to the material of the CCP-NOL spacer layer 16 is selected. Here, the same polarity means the combination of tensile stresses (positive polarity) or compression stresses (negative polarity).

Figure 3:
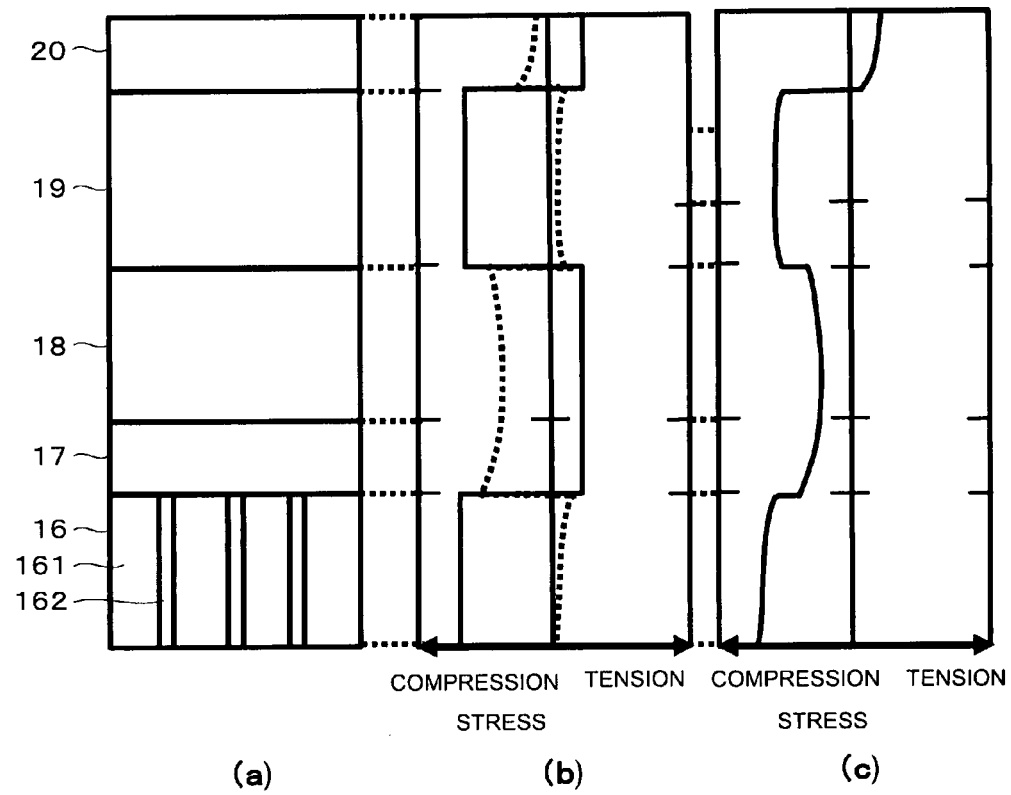
FIG. 3 is a conceptual diagram showing an internal stress of a CCP-CPP spin-valve film in which the thin film insertion layer is inserted.

FIG. 3 is a conceptual diagram showing internal stress of the CCP-CPP spin-valve film in which the thin film insertion layer 19 is inserted. (a), (b) and (c) in FIG. 3 respectively show (a) a sectional view, (b) stress (solid line) peculiar to the material of each layer and stress which each layer receives from the adjacent layer, and (c) the actual stress of each layer.

As shown by the solid line in (b) of FIG. 3, the metal layer 17 and the free layer 18 are sandwiched by the spacer layer 16 and the thin film insertion layer 19 both have large compression stresses. Therefore, by the external stress (shown by the broken line) which each layer receives from the adjacent layer, large compression stress is applied to the metal layer 17 and the free layer 18. As a result, the actual internal stress in the metal layer 17 and the free layer 18 becomes the compression stress, and the change in stress from the interface of the spacer layer 16 and the metal layer 17 to the free layer 18 becomes gradual (see (c) in FIG. 3).

As a result, even when migration of atoms in accordance with the internal stress occurs due to heat generation at the time of current energization, migration of atoms becomes close to the adjacent layers since the change in the internal stress from the spacer layer 16 to the free layer 18 is gradual. Thereby, a phenomenon which causes reduction in spin-dependent interface scattering effect such as lattice mismatch, mixing of atoms and increase in roughness can be prevented.

In the CCP-CPP spin-valve film in which the thin film insertion layer 19 is inserted, change in the internal stress in the interface of the thin film insertion layer 19 and the cap layer 20 becomes abrupt. However, this does not become a large problem for the following reasons (1) and (2). Namely, (1) Since it is sufficiently apart from the CCP-NOL spacer layer 16, temperature rise at the time of current energization is small. (2) Since it is outside the spin-dependent scattering unit, reduction in MR rate of change hardly occurs even if deterioration of the structure occurs.

Concrete materials of the spacer layer 16 and the thin film insertion layer 19 will be described. The present inventors produced the single layer films of various kinds of oxide materials, and examined the stress values peculiar to the respective oxide materials by the substrate curvature measuring method. As the result, the materials having compression stress and their stress values are shown in Table 1, and the materials having tensile stress and their stress values are shown in Table 2. The substrate curvature measuring method is a method for measuring internal stress of a film from deflection (curvature) occurring to the substrate by forming the film on the substrate.

TABLE 1

| MATERIAL HAVING COMPRESSION STRESS (TENSILE STRESS: POSITIVE) | |
| --- | --- |
| OXIDE MATERIAL | STRESS VALUE (UNIT: MPa) |
| $Al_2O_3$ | −250 to −400 |
| $SiO_2$ | −700 to −800 |
| MgO | −150 to −200 |
| ZnO | −1000 to −1600 |
| $Ta_2O_5$ | −100 to −200 |

TABLE 2

| MATERIAL HAVING TENSILE STRESS (TENSILE STRESS: POSITIVE) | |
| --- | --- |
| OXIDE MATERIAL | STRESS VALUE (UNIT: MPa) |
| $TiO_2$ | 100 to 200 |

When the oxides having compression stress shown in Table 1 are used as the composing material (insulating material such as an oxide) of the insulating layer 161 of the spacer layer 16, the oxide layer selected from Table 1 having compression stress similarly to the spacer layer 16 is used as the thin film insertion layer 19. On the other hand, when the oxide having the tensile stress shown in Table 2 is used as the composing material of the insulating layer 161 of the spacer layer 16, the oxide layer selected from Table 2 having the tensile stress similarly to the spacer layer 16 is used as the thin film insertion layer 19.

In this case, the oxide is described as an example as the insulator, but it is possible to use a nitride or an oxynitride as the insulator. It is possible to use ordinary insulating materials having stress of the same polarity as stress of the spacer layer 16 as the composing material of the thin film insertion layer 19.

The film thickness of the thin film insertion layer 19 may be in the range in which the stress control effect can be obtained and decrease in MR ratio due to increase in resistance is not seen, but it is preferably 0.5 nm to 1.5 nm for the following reason.

The magnitude of the stress applied to the adjacent layer by the thin film insertion layer 19 is proportional to the product $\sigma_{ADJ} \cdot t_{ABJ}$ of the internal stress $\sigma_{ADJ}$ and the film thickness $t_{ABJ}$ of the oxide material. Therefore, if the film thickness of the thin film insertion layer 19 is too thin, it cannot exhibit the function of stress control, and larger the film thickness of the thin film insertion layer 19, the more effectively stress control can be performed. In order to exhibit the stress control function, the film thickness of the thin film insertion layer 19 is desirably 0.5 nm or more.

When the film thickness of the thin film insertion layer 19 is too thick, the resistance of the thin film insertion layer 19 increases, and resistance outside the spin-dependent scattering unit of the CCP-CPP element is increased, whereby the phenomenon of the MR rate of change is caused. Therefore, in the case of using any oxide-material, the film thickness of the thin film insertion layer 19 is desirably 1.5 nm or less.

As the material of the thin film insertion layer 19, an oxide, a nitride or an oxynitride including at least one kind of element selected from a group constituted of Al, Si, Mg, Ti, Ta and Zn is adopted as the major constituent.

The film thickness of the metal layer 17 and the free layer 18 is desirably in the range in which stress control by the thin film insertion layer 19 is effective. When the sum of the film thickness of the metal layer 17 and the free layer 18 is too large, it becomes difficult to make stress change of the spin-dependent scattering unit of the spacer layer 16 to the free layer 18 gradual. This is because the stress control action of the thin film insertion layer 19 is hardly exerted to the area in the vicinity of the CCP-NOL spacer layer 16. Therefore, the sum of the film thickness of the metal layer 17 and the free layer 18 is preferably 10 nm or less, and is more preferably 5 nm or less.

In this embodiment, the thin film insertion layer 19 having the stress of the same polarity as the spacer layer 16 is provided on the free layer 18. Thereby, a gap between the internal stress of the metal layer 17 and the free layer 18 on the spacer layer 16, and the internal stress of the spacer layer 16 is reduced. Therefore, a gap of the atom immigration of the respective layers in accordance with the internal stress by heat generation at the time of current energization as described above is reduced, and reduction in spin-dependent interface scattering can be suppressed.

As a result, the magnetoresistive effect element which does not cause reduction in MR rate of change even if current energization for a long time is performed and is enhanced in reliability can be provided.

(3) The Case Provided with the Metal Layer 22 Under the Thin Film Insertion Layer 19

Figure 4:
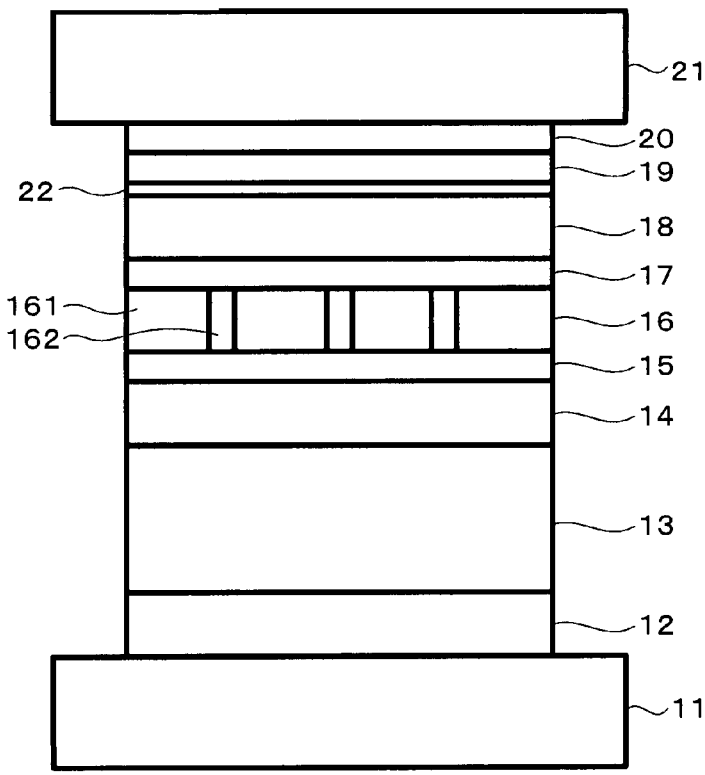
FIG. 4 is a sectional view showing a section of a magnetoresistive effect element provided with a metal layer 22 in the first embodiment.

As shown in FIG. 4, the metal layer 22 may be provided between the free layer 18 and the thin film insertion layer 19. The metal layer 22 functions as a barrier layer which protects the free layer 18 which is deposited under the metal layer 22 from being in contact with an oxide of the thin film insertion layer 19 and oxidized.

Depending on the material of the thin film insertion layer 19 and the material of the free layer 18, the metal layer 22 may not necessarily provided as in the magnetoresistive effect element shown in FIG. 1. Oxidization of the free layer 18 is avoided by optimization of the annealing conditions, selection of the material of the thin film insertion layer 19, the material of the free layer 18 and the like, and the metal layer 22 between the free layer 18 and the thin film insertion layer 19 can be made unnecessary. However, in consideration of the margin in manufacture, it is preferable to form the metal layer 17 on the spacer layer 16.

When the metal layer 22 is provided, the film thicknesses of the metal layer 17, the free layer 18 and the metal layer 22 is preferably in the range in which stress control by the thin film insertion layer 19 is effective. When the sum of the film thickness of the metal layer 17, the free layer 18 and the metal layer 22 is too large, it becomes difficult to make the stress change of the spin-dependent scattering unit of the spacer layer 16 to the free layer 18 gradual. This is because the stress control action of the thin film insertion layer 19 is hardly exerted to the area in the vicinity of the CCP-NOL spacer layer 16. Therefore, the sum of the thickness of metal layer 17, the free layer 18 and the metal layer 22 is preferably 10 nm or less, and is more preferably 5 nm or less.

(4) Application to Top Type CCP-CPP Elements

In this embodiment, the bottom type CCP-CPP element in which the pinned layer 14 is located below the free layer 18 is described as an example as the magnetoresistive effect element. Concerning this, stress control by the thin film insertion layer 19 is also possible in the top type CCP-CPP element in which the pinned layer 14 is disposed above the free layer 18.

Figure 5:
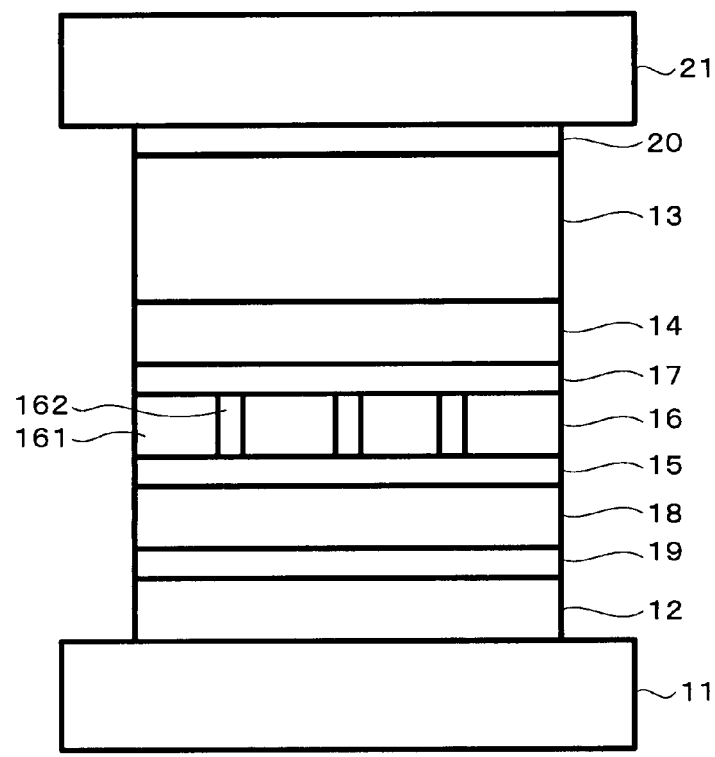
FIG. 5 is a sectional view showing a section of a top type magnetoresistive effect element in the first embodiment.

In a top type CCP-CPP element, on a substrate, the lower electrode 11, the foundation layer 12, the free layer 18, the metal layer 15, the spacer layer (CCP-NOL) 16, the metal layer 17, the pinned layer 14, the pining layer 13, the cap layer 20 and the upper electrode 21 are disposed in sequence. As shown in FIG. 5, by disposing the thin film insertion layer 19 between the foundation layer 12 and the free layer 18, reliability by stress control in the vicinity of the spacer layer 16 can be enhanced.

Figure 6:
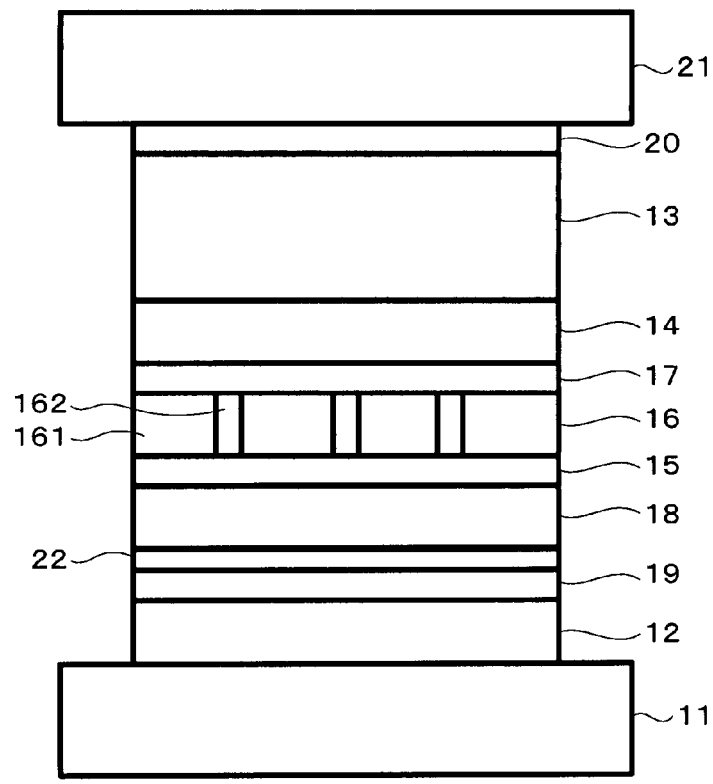
FIG. 6 is a sectional view showing a section of a top type magnetoresistive effect element provided with the metal layer 22 in the first embodiment.

In the case of the top type CCP-CPP element, the metal layer 22 may be provided between the thin film insertion layer 19 and the free layer 18 as shown in FIG. 6.

(Production of the Thin Film Insertion Layer 19)

For production of the thin film insertion layer 19, a direct sputtering method by the target of an oxide, a nitride or an oxynitride can be used. By the direct sputtering method, an oxide, a nitride or an oxynitride itself can be deposited. As the material of the target, an oxide, a nitride or an oxynitride including at least one kind of element selected from a group constituted of Al, Si, Mg, Ti, Ta and Zn can be used.

Production of the thin film insertion layer 19 can be performed by oxidation of the metal material after deposition. For example, after deposition is performed by using a target including at least one kind of element selected from a group constituted of Al, Si, Mg, Ti, Ta and Zn which are base materials of oxides, an oxidizing gas is supplied to form the oxide.

As the method for oxidation, natural oxidation in which a metal film of the base material is brought into contact with an oxidizing atmosphere and oxidized can be used. Oxidation using an energy assist effect by irradiation of RF plasma or ion beam of oxygen may be adopted. The latter is more preferable since a stable oxide can be obtained.

The above described method is also effective in the case of nitridation and oxynitridation. For example, by irradiating plasma and ion of a nitrogen gas and a mixture gas of nitrogen and oxygen, a metal can be nitrided or oxynitrided, and the thin film insertion layer 19 can be produced.

Second Embodiment

Figure 7:
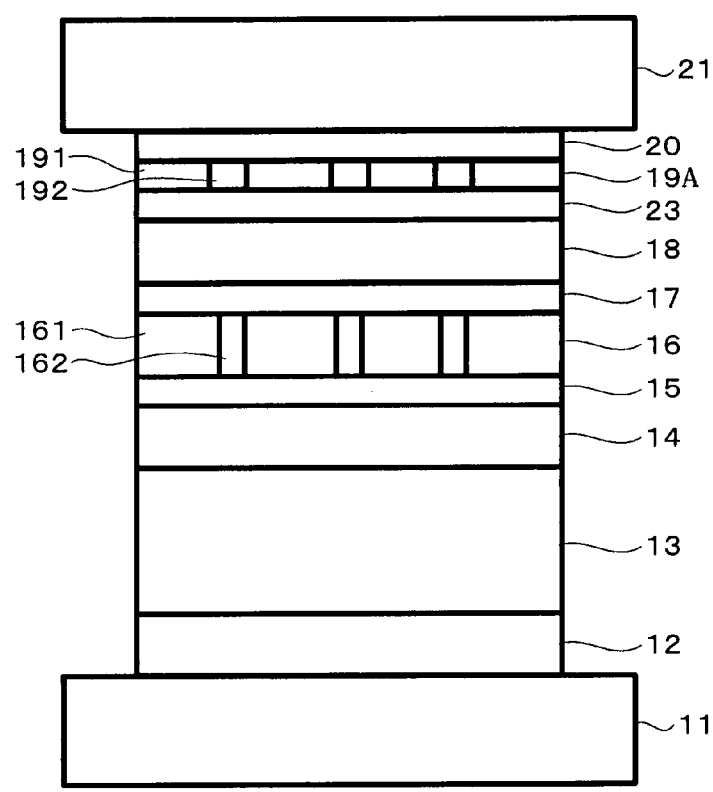
FIG. 7 is a sectional view showing a section of a magnetoresistive effect element according to a second embodiment.

FIG. 7 is a sectional view showing a section of a magnetoresistive effect element (CCP-CPP element) according to a second embodiment of the present invention. In this embodiment, as compared with the first embodiment, a metal layer 23 is added, and the film structure of a thin film insertion layer 19A differs.

The film structure of the thin film insertion layer 19A is a CCP-NOL structure, and has an insulating layer 191 and a current path 192. The metal layer 23 is used for formation of the current path 192, and is a so-called supply source of the current path 192. However, the metal layer 23 does not have to remain as a definite metal layer after formation of the current path 192.

By making the thin film insertion layer 19A have the CCP-NOL structure, the thin film insertion layer 19A is made thick and effective stress control is made possible without increasing the resistance value of the magnetoresistive effect element.

However, even in the case of using the CCP-NOL structure for the thin film insertion layer 19A, if the film thickness becomes 2.0 nm or larger, it becomes difficult to form the current path 192 in production process. Therefore, the film thickness of the thin film insertion layer 19A is preferably 0.5 nm to 2.0 nm.

The density of the current path 192 of the thin film insertion layer 19A may be in the range in which the stress control effect is obtained and decrease in the MR ratio due to increase in resistance is not seen. For the following reason, the density is preferably from 30% to 60% inclusive. In this case, an density R is the ratio (S2/S0) of an area S2 of the current path to an area S0 of the thin film insertion layer 19A.

A product $\sigma 0 \cdot S0$ of a stress value $\sigma 0$ of the thin film insertion layer 19A and its area S0 equals to the sum of a product $\sigma 1 \cdot S1$ of internal stress $\sigma 1$ of the insulating layer 191 and its area S1, and a product $\sigma 2 \cdot S2$ of internal stress $\sigma 2$ of the current path 192 and an area S2. Namely, the following expression (1) is formulated.

$$\sigma 0 \cdot S0 = \sigma 1 \cdot S1 + \sigma 2 \cdot S2 \quad \text{expression (1)}$$

From the expression (1), the following expression (2) is formulated.

$$\sigma 0 = 1 \cdot (1-R) + (\sigma 2 \cdot R) \quad \text{expression (2)}$$

Expression (2) means that when the density R of the current path 192 becomes large, the stress value $\sigma 0$ of the thin film insertion layer 19A is away from the internal stress $\sigma 1$ of the insulating layer 191, and becomes close to the internal stress $\sigma 2$ of the current path 192. In this case, the absolute value of the internal stress $\sigma 2$ of the current path 192 is smaller than the absolute value of the internal stress $\sigma 1$ of the insulating layer 191. Therefore, when the density R becomes too large, the absolute value of the stress value $\sigma 0$ of the thin film insertion layer 19A becomes small, and it becomes difficult to exhibit the stress control function. In order to exhibit the stress control function, the opening ratio of the current path 192 of the thin film insertion layer 19A is preferably 60% or less.

When the density of the thin film insertion layer 19A is too small on the other hand, the resistance of the thin film insertion layer 19A increases. This means that the resistance of the CCP-CPP element outside the spin-dependent scattering unit increases, and causes decrease in the MR rate of change. Therefore, the density of the current path 192 of the thin film insertion layer 19A is preferably 30% or more.

From the above described reason, the density of the current path 192 of the thin film insertion layer 19A is preferably from 30% to 60% inclusive.

(Production of the Thin Film Insertion Layer 19A)

Figure 8:
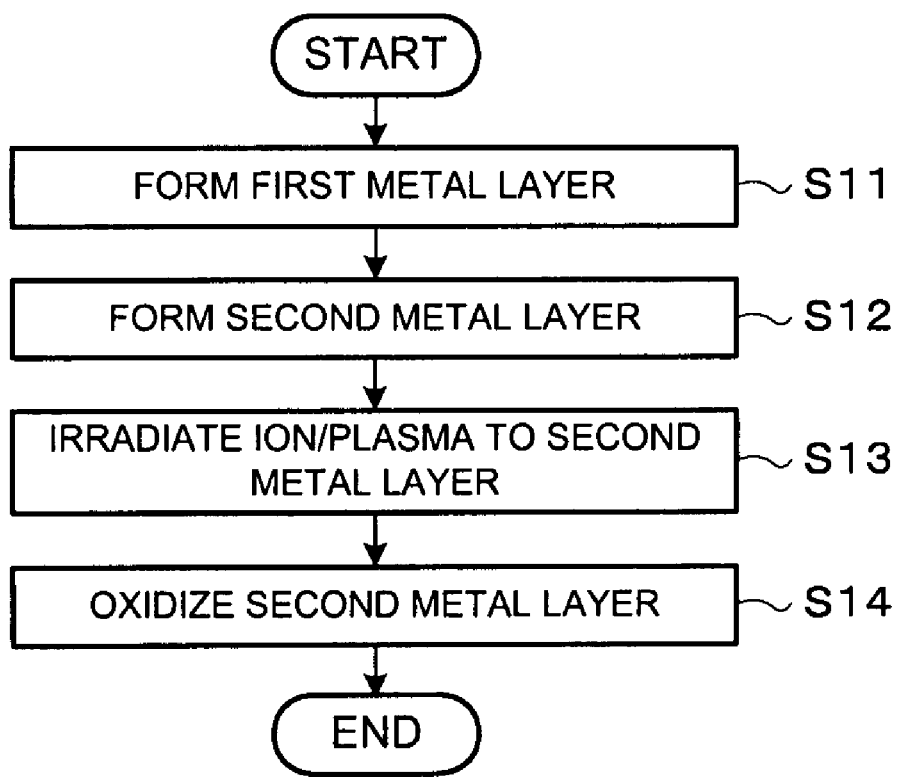
FIG. 8 is a flow chart showing one example of a production procedure of the thin film, insertion layer.

FIG. 8 is a flow chart showing one example of the production procedure of the thin film insertion layer 19A.

The thin film insertion layer 19A of the CCP-NOL structure can be produced as follows.

(1) Formation of the Metal Layer 23 (First Metal Layer) (Step S11)

The metal layer 23 is formed on the free layer 18. The metal layer 23 is the layer to be the supply source of the current path 192 of the thin film insertion layer 19A, and is composed of Cu, Ag or Au.

(2) Formation of the Metal Layer to be Oxidized (Second Metal Layer) (Step S12)

A metal layer to be oxidized is formed on the metal layer 23. The metal layer to be oxidized is a layer which is converted into an oxide layer (insulating layer 191) of the thin film insertion layer 19A, and includes at least one kind of element selected from a group constituted of Al, Si, Mg, Ti, Ta and Zn.

(3) Irradiation of Ion or Plasma to the Metal Layer to be Oxidized (Step S13)

Ion or plasma is irradiated to the metal layer to be oxidized. Ion beam or RF plasma of a rare gas (for example, Ar) is irradiated to the surface of the metal layer to be oxidized. This pretreatment is called a PIT (Pre-ion treatment) process step. As a result of the PIT process step, part of the metal layer 23 is sucked up and enters the metal layer to be oxidized.

(4) Oxidization of the Metal Layer to be Oxidized (Step S14)

The metal layer to be oxidized is oxidized. More specifically, an oxidizing gas (for example, $O_2$) is supplied while irradiation of ion beam or RF plasma of a rare gas (for example, Ar) is performing, and the metal layer to be oxidized is converted into the oxide layer. By the oxidation treatment (IAO: Ion beam-assisted Oxidation), the thin film insertion layer 19A of the CCP-NOL structure in which the current path 192 such as Cu penetrates through the oxide material (insulating layer 191) in the stacking direction is produced.

EXAMPLES

Hereinafter, examples of the present invention will be described with reference to the drawings.

Example 1

In this example, the magnetoresistive effect element having the stacked structure shown in FIG. 1 was produced.
Lower electrode 11
Foundation layer 12: Ta [5 nm]/Ru [2 nm]
Pining layer 13: $Pt_{50}Mn_{50}$ [15 nm]
Pinned layer 14: $Co_{90}Fe_{10}$ [3.6 nm]/Ru [0.9 nm]/{($Fe_{50}Co_{50}$ [1 nm]/Cu [0.25 nm])×2/$Fe_{50}Co_{50}$ [1 nm]}
Metal layer 15: Cu [0.5 nm]
Spacer layer 16: $Al_2O_3$ insulating layer 161 and Cu current path 162 [1.5 nm]
Metal layer 17: Cu [0.25 nm]
Free layer 18: $Co_{90}Fe_{10}$ [1 nm]/$Ni_{83}Fe_{17}$ [3.5 nm]

Thin film insertion layer 19: oxide material having compression stress written in Table 1 [0.2 to 1.5 nm]

Cap layer 20: Cu [1 nm]/Ta [5 nm]

Upper electrode 21

The lower electrode 11 for passing the sense current in the direction perpendicular to the spin-valve film was formed on the substrate.

Ta [5 nm]/Ru [2 nm] was deposited as the foundation layer 12 on the lower electrode 11. Ta is the buffer layer 12a which relieves roughness of the lower electrode. Ru is the seed layer 12b which controls the crystal orientation and the crystal grain size of the spin-valve film that is deposited thereon.

As the buffer layer 12a, Ti, Zr, Hf, V, Cr, Mo, and W, and alloy materials of them may be used instead of Ta. The film thickness of the buffer layer 12a is preferably 3 to 5 nm. When the buffer layer 12a is too thin, the buffer effect is lost. When the buffer layer 12a is too thick on the other hand, the series resistance increase is caused when the sense current is passed in the perpendicular direction, and therefore, the too thick buffer layer 12a is not preferable.

As the seed layer 12b, it is preferable to use the material having the hcp structure (hexagonal close-packed structure) or the fcc structure (face-centered cubic structure).

When Ru is used as the seed layer 12b, the crystal orientation of the spin-valve film which is deposited thereon can be made fcc (111) orientation, the crystal orientation of PtMn can be made fct (111) orientation, and the crystal orientation of the bcc structure can be made bcc (110) orientation.

By providing the seed layer 12b, the crystal grain size of the spin-valve film which is deposited thereon can be controlled to be 10 to 40 nm. Therefore, even if the element size becomes small, variation in occupation rate of the metal path among the elements is not caused, and the appropriate area resistance RA and high MR can be realized.

The film thickness of the seed layer 12b is preferably 2 to 6 nm. If the thickness of the seed layer 12b is too small, the control effect of the crystal orientation is lost. The buffer layer 12b with too large film thickness causes increase in series resistance when a sense current is passed in the perpendicular direction, and is not preferable.

$Pt_{50}Mn_{50}$ [15 nm] was deposited on the foundation layer 12 as the pining layer 13. The pinning layer 13 has the roll of fixing the magnetization direction of the pinned layer 14 which is deposited thereon. The pinning layer 13 with too small film thickness does not exhibit a pin fixing function, and is not preferable, and the pinning layer 13 with too large film thickness is not preferable from the viewpoint of gap narrowing. When $Pt_{50}Mn_{50}$ is used as the pinning layer 13, the film thickness of $Pt_{50}Mn_{50}$ is preferably about 8 to 20 nm, and is more preferably 10 to 15 nm.

As the antimagnetic material used for the pinning layer 13, PdPtMn and IrMn are cited other than PtMn. IrMn exhibits a pin fixing function with smaller film thickness than PtMn and PdPtMn, and is preferable in the viewpoint of gap narrowing. When IrMn is used as the pinning layer 13, the film thickness of IrMn is preferably 4 to 12 nm, and is more preferably 5 to 10 nm.

The pinned layer 14 was deposited on the pinning layer 13. In this example, as the pinned layer 14, the synthetic pinned layer composed of the lower pinned layer 141 ($Co_{90}Fe_{10}$ [3.6 nm]), the magnetic coupling intermediate layer 142 (Ru [0.9 nm], the upper pinned layer 143 {($Fe_{50}Co_{50}$ [1 nm]/Cu [0.25 nm])×2/$Fe_{50}Co_{50}$ [1 nm]} was used.

The lower pinned layer 141 makes exchange magnetic coupling with the pinning layer 13, and has unidirectional anisotropy. The lower pinned layer 141 and the upper pinned layer 143 are magnetically coupled via the magnetic coupling intermediate layer 142 so that the magnetization directions are antiparallel with each other.

The lower pinned layer 141 is preferably designed so that the magnetic film thickness, namely, saturation magnetization Bs×film thickness t (Bs·t product) is substantially equal to the upper pinned layer 143. In this example, the upper pinned layer 143 is ($Fe_{50}Co_{50}$ [1 nm]/Cu [2.5 nm])×2/$Fe_{50}Co_{50}$ [1 nm], and the saturation magnetization of FeCo is about 2.2 T, and therefore, the magnetic film thickness is 2.2 T×3 nm=6.6 Tnm. As for the lower pinned layer 141, the saturation magnetization of $Co_{90}Fe_{10}$ is about 1.8 T, and the film thickness t of the lower pinned layer 141 which gives the magnetization film thickness equal to the above description is 6.6 Tnm/1.8 T=3.66 nm. In this example, $Co_{90}Fe_{10}$ of the film thickness of 3.6 nm was used.

From the viewpoint of the unidirectional anisotropy magnetic field intensity by the pinning layer 13 (PtMn) and the antiferromagnetic coupling magnetic field intensity of the lower pinned layer 141 and the upper pinned layer 143 via Ru, the film thickness of the magnetic layer used for the lower pinned layer 141 is preferably about 2 to 5 nm. If the film thickness is too small, the MR rate of change becomes small. If the film thickness is too large, it becomes difficult to obtain a sufficient unidirectional anisotropic magnetic field necessary for device operation.

For the lower pinned layer 141, for example, a $Co_xFe_{100-x}$ alloy (x=0 to 100%), $Ni_xFe_{100-x}$ alloy (x=0 to 100%) or materials made by adding a nonmagnetic element to them can be used.

The magnetic coupling intermediate layer (Ru layer) 142 has the function of forming the synthetic pin structure by causing antiferromagnetic coupling between the upper and lower magnetic layers. The film thickness of the magnetic coupling intermediate layer 142 is preferably 0.8 to 1 nm. Materials other than Ru may be used as long as the materials cause sufficient antiferromagnetic coupling between the upper and lower magnetic layers.

The upper pinned layer 143 {($Fe_{50}Co_{50}$ [1 nm]/Cu [2.5 nm])×2/$Fe_{50}Co_{50}$ [1 nm]} forms part of the spin-dependent interface scattering unit. The magnetic material located in the interface with the spacer layer 16 is especially important in the respect that it contributes to spin-dependent field scattering. In this example, $Fe_{50}Co_{50}$ having the bcc structure was used.

When the magnetic material having the bcc structure is used in the interface with the spacer layer 16, a large spin-dependent interface scattering effect is obtained, and therefore, a large MR rate of change can be realized. As the FeCo alloy having the bcc structure, $Fe_xCo_{100-x}$ (x=30 to 100%), and $Fe_xCo_{100-x}$ to which an additive element is added are cited.

The Metal material used for the spin valve film is of the fcc structure (face-centered cubic structure) or the fct structure (face-centered tetragonal structure) in many cases, and therefore, it sometimes happens that only the upper pinned layer 143 has the bcc structure. Therefore, the upper pinned layer 143 with too small film thickness is not preferable since such an upper pinned layer 143 makes it difficult to keep the bcc structure stable and makes it impossible to obtain a high MR rate of change. The film thickness of the magnetic material which functions as the upper pinned layer 143 (the pinned layer 14 between the spacer layer 16 and Ru) is preferably 2 nm or more, and is preferably 5 nm or less to obtain a large pin fixing magnetic field.

When the pinned layer 14 is formed from the magnetic layer with the bcc structure which easily realizes a high MR rate of change, the film thickness of the layer having the bcc structure is preferably 2 nm or more to keep the bcc structure more stable. In order to obtain a large pin fixing magnetic field and keep stability of the bcc structure, the range of the film thickness of the pinned layer 14 having the bcc structure is preferably about 2.5 nm to 4 nm.

As the composing material of the pinned layer 14, $Fe_{75}Co_{25}$ to $Fe_{85}Co_{15}$ or the like which are in the composition range in which the bcc structure can be obtained more stably in the phase diagram are cited. For the upper pinned layer 143, a CoFe alloy of the fcc structure and a cobalt alloy having the hcp structure can be used instead of the magnetic material having the bcc structure. A single metal such as Co, Fe and Ni, and an alloy material including at least any one element of them can be all used. Listing the magnetic materials of the upper pinned layer 143 in the order of being advantageous in obtaining a large MR rate of change, alloy materials having the bcc structure, cobalt alloys having cobalt composition of not less than 50%, and nickel alloys having Ni composition of not less than 50% are listed in this order.

In this example, as the upper pinned layer 143, the layer made by alternately stacking the magnetic layer (FeCo layer) and the nonmagnetic layer (extra-thin Cu layer) was used. In the upper pinned layer 143 having such a structure, the spin-dependent scattering effect called a bulk scattering effect can be enhanced. In the CCP-CPP element, a current is confined in the vicinity of the spacer, and therefore, contribution of resistance in the vicinity of the field of the spacer layer 16 becomes very large. In this case, contribution of the field scattering effect is larger than the bulk scattering effect, and therefore, selection of the material located in the interface with the spacer layer 16 has important meaning. However, use of a material having a large bulk scattering effect is effective.

The film thickness of the Cu layer between the magnetic layers is preferably 0.1 to 1 nm, and is more preferably 0.2 to 0.5 nm. If the film thickness of the Cu layer is too small, the effect of enhancing the bulk scattering effect becomes small. If the film thickness of the Cu layer is too large, the bulk-scattering effect is sometimes decreased, in addition to which, magnetic coupling of the upper and lower magnetic layers via the nonmagnetic Cu layer becomes weak, and the characteristics of the pinned layer 14 become insufficient.

As the material of the nonmagnetic layer between the magnetic layers, Hf, Zr, Ti and the like may be used instead of Cu. The film thickness of the magnetic layer such as FeCo is preferably 0.5 to 2 nm, and is more preferably about 1 to 1.5 nm.

Instead of the upper pinned layer 143 with the FeCo layers and the Cu layers alternately stacked, the upper pinned layer 143 with FeCo and Cu alloyed may be used. As such an FeCoCu alloy, for example $(Fe_xCo_{100-x})_{100-y}Cu_y$ (x=30 to 100%, y=3 to about 15%) is cited, but the composition range other than this may be used. As the element which is added to FeCo, the other elements such as Hf, Zr and Ti may be used instead of Cu.

For the upper pinned layer 143, single-layer films composed of, Co, Fe, Ni, or alloy materials of them may be used. For example, as the upper pinned layer 143 of the simplest structure, a $Co_{90}Fe_{10}$ single layer may be used. An element may be added to such materials.

After Cu was deposited on the pinned layer 14 as the metal layer 15 to be a supply source of the current path 162 of the spacer layer 16, the AlCu layer was deposited as the metal layer to be oxidized which is converted into the insulating layer of the spacer layer 16.

Pretreatment was performed by irradiating ion beam of a rare gas (for example, Ar) to the metal layer to be oxidized. The pretreatment is called PIT (Pre-ion treatment). As a result of PIT, part of the metal layer 15 was sucked up and enters the metal layer to be oxidized.

Thereafter, an oxidizing gas (for example, $O_2$) was supplied to oxidize the metal layer to be oxidized. By the oxidation, the metal layer to be oxidized was converted into the insulating layer 161 composed of $Al_2O_3$. In this manner, the spacer layer 16 composed of the insulating layer 161 and the current path 162 which penetrated through it was formed.

The film thickness of Cu, which is the first metal layer to be the current path, is controlled in accordance with the film thickness of AlCu. This is because when the thickness of the AlCu is made large, the amount of Cu to be caused to enter AlCu has to be increased in order to keep the occupation rate of the current path. If the film thickness of Cu is smaller than the appropriate range, the occupation rate of the current path reduces and the area resistance becomes higher than the appropriate value. When the film thickness of Cu is larger than the appropriate range, the current confined by CCP-NOL spreads into Cu before it reaches the magnetic layer and causes reduction in the MR rate of change, which is not preferable.

As the metal layer 15, a material which is resistant to oxidizing and low in specific resistance is desirable. Au, Ag and the like may be used in place of Cu.

When AlCu is used as the metal layer to be oxidized, in the first oxidizing process, not only Cu is sucked up from the first metal layer, but also Cu in the AlCu is separated from Al. In this case, the current path is formed from Cu of both the first metal layer and the metal layer to be oxidized. In this example, $Al_{90}Cu_{10}$ was used as the metal layer to be oxidized, but pure Al which does not include Cu may be used as the metal layer to be oxidized. When pure Al is used, the current path is formed by only Cu which is sucked up.

The material of the metal layer to be oxidized is not limited to an Al alloy for forming $Al_2O_3$, but may be Si, Mg, Ta, Zn and the like and alloys adopting them as major constituents. The insulating layer which is converted from the metal layer to be oxidized is not limited to an oxide, but may be a nitride or an oxynitride. In the case of using any material as the metal layer to be oxidized, the film thickness at the time of deposition is preferably 0.5 to 2 nm, and the film thickness after converted into an oxide, a nitride or an oxynitride is preferably about 0.8 to 3.5 nm.

Cu [0.25 nm] is deposited on the spacer layer 16 as the metal layer 17. The metal layer 17 has the function as a barrier layer which prevents the free layer 18 which is deposited on the metal layer 17 from being in contact with the oxide of the spacer layer 16 and oxidized.

Oxidation of the free layer 18 can be avoided by optimization of annealing conditions in some cases, and therefore, the metal layer 17 on the spacer layer 16 does not always have to be provided. The metal layer 15 under the spacer layer 16 is essential because it is the supply source of the current path 162, but the metal layer 17 on the spacer layer 16 is not essential. However, in consideration of a manufacturing margin, it is preferable to form the metal layer 17 on the spacer layer 16.

As the material of the metal layer 17, Au, Ag, Ru and the like may be used other than Cu. However, the material of the metal layer 17 is preferably the same material as the material of the current path 162. When a different kind of material from the material of the current path 162 is used as the material of the metal layer 17, increase in interface resistance is caused, but if both of them are the same materials, increase in interface resistance does not occur. The film thickness of the metal layer 17 is preferably 0 to 1 nm, and is more preferably 0.1 to 0.5 nm. If the metal layer 17 is too thick, the current confined in the spacer layer 16 spreads in the metal layer 17 to make the current confining effect insufficient and cause reduction in MR rate of change.

$Co_{90}Fe_{10}$ [1 nm]/$Ni_{83}Fe_{17}$ [3.5 nm] was deposited on the metal layer 17 as the free layer 18. In order to obtain a high MR rate of change, selection of the magnetic material of the free layer 18 located in the interface with the spacer layer 16 is important. In this case, it is more preferable to provide a CoFe alloy than NiFe alloy. In this example, $Co_{90}Fe_{10}$ which is especially stable in soft magnetic properties among CoFe alloys was used.

In the case of using CoFe alloys in the vicinity of $Co_{90}Fe_{10}$, the film thickness is preferably made 0.5 to 4 nm.

In the case of using CoFe alloys of other compositions (for example, the composition described in association with the pinned layer 14), the film thickness is preferably made 0.5 to 2 nm. In order to increase the spin-dependent interface scattering effect, for example, use of $Fe_{50}Co_{50}$ (or $Fe_xCo_{100-x}$ (x=45 to 85)) having the bcc structure also for the free layer 18 as the pinned layer 14 is conceivable. Since in this case, the free layer 18 keeps soft magnetism, too large film thickness cannot be used, and 0.5 to 1 nm is the preferable film thickness range.

In the case of using Fe which does not include Co, relatively favorable soft magnetic properties are provided, and therefore, the film thickness can be made about 0.5 to 4 nm.

The NiFe layer provided on the CoFe layer is a material stable in soft magnetic properties. Soft magnetic properties of the CoFe alloy are not so stable, but by providing an NiFe alloy thereon, soft magnetic properties can be supplemented, and a large MR rate of change can be obtained.

The composition of the NiFe alloy is preferably $Ni_xFe_{100-x}$ x=about 78 to 85%). In this example, the composition richer in Ni ($Ni_{83}Fe_{17}$) than the composition $Ni_{81}Fe_{19}$ of NiFe usually used was used. This is because when the free layer 18 is formed on the spacer layer 16 having the CCP structure, the Ni composition for realizing zero magnetic strain is shifted more or less. The film thickness of the NiFe layer is preferably about 2 to 5 nm.

When the NiFe layer is not used, the free layer 18 in which a plurality of CoFe layers or Fe layers each of 1 to 2 nm, and a plurality of extra-thin Cu layers each of about 0.1 to 0.8 nm are alternately stacked may be used.

The film thickness of the metal layer 17 and the free layer 18 has respective desirable film thickness ranges as described above, and the sum of the film thickness of them is desirably in the range in which stress control by the thin film insertion layer 19 is effectively obtained. When the sum of the film thickness of the metal layer 17 and the free layer 18 is too large, it becomes difficult to make the change of stress of the spin-dependent scattering unit of the spacer layer 16 to the free layer 18 gradual. This is because the stress control action of the thin film insertion layer 19 is hardly exerted on an area in the vicinity of the CCP-NOL spacer layer 16. Therefore, the sum of the film thickness of the metal layer 17 and the free layer 18 is desirably not more than 10 nm, and is further desirably not more than 5 nm. In this example, Cu [0.25 nm] as the metal layer 17, $Co_{90}Fe_{10}$ [1 nm]/$Ni_{83}Fe_{17}$ [3.5 nm] as the free layer 18 were provided. Therefore, the sum of the film thickness of the metal layer 17 and the free layer 18 is 4.75 nm.

An oxide material was stacked on the free layer 18 as the thin film insertion layer 19. In this example, $Al_2O_3$ having compression stress is used as the CCP-NOL spacer layer 16. Therefore, for the thin film insertion layer 19, as the oxide materials having the same compression stress, $Al_2O_3$, $SiO_2$, MgO, ZnO and $Ta_2O_5$ were used among the materials shown in Table 1 of the embodiments.

The film thickness of the thin film insertion layer 19 can be in any range in which stress control effect is obtained, and decrease in MR ratio due to increase in resistance is not seen. From the following reason, the film thickness of the thin film insertion layer 19 is desirably 0.5 nm to 1.5 nm.

The magnitude of the stress the thin film insertion layer 19 applies to the adjacent layer is proportional to the product $\sigma_{ADJ} \cdot t_{ADJ}$ of the internal stress $\sigma_{ADJ}$ and the film thickness $t_{ADJ}$ of the oxide material. Therefore, when the film thickness of the thin film insertion layer 19 is too small, it cannot exhibit the function of stress control, and as the film thickness of the thin film insertion layer 19 is larger, stress control can be performed more effectively. In order to exhibit the stress control function, the film thickness of the thin film insertion layer 19 is desirably 0.5 nm or more.

If the film thickness of the thin film insertion layer 19 is too large on the other hand, resistance of the thin film insertion layer 19 increases, and the resistance of the CCp-CPP element outside the spin-dependent scattering unit is increased, thus causing the phenomenon of the MR rate of change. Therefore, in the case of using any oxide material, the film thickness of the thin film insertion layer 19 is desirably 1.5 nm or less.

In this example, the thin film insertion layer 19 was properly controlled with various kinds of oxide materials in the range of 0.5 nm to 1.5 nm, which was the film thickness range where the stress control function was able to be exhibited, and produced without increasing the resistance of the thin film insertion layer 19.

In this example, as shown in FIG. 1, the thin film insertion layer 19 is provided on the free layer 18, but as shown in FIG. 2, the metal layer 22 may be provided between the free layer 18 and the thin film insertion layer 19. The metal layer 22 has the function as the barrier layer which prevents the free layer 18 deposited under it from being in contact with the oxide of the thin film insertion layer 19 and oxidized.

Oxidization of the free layer 18 can be avoided by optimization or the like of the annealing conditions in some cases, and therefore, the metal layer 22 between the free layer 18 and the thin film insertion layer 19 does not need to be always provided. However, considering the manufacturing margin, it is preferable to form the metal layer 22 between the free layer 18 and the thin film insertion layer 19. As the material of the metal layer 22, Cu, Au, Ag, Ru and the like can be used. The film thickness of the metal layer 22 is preferably 0 to 1 nm, and is more preferably 0.1 to 0.5 nm.

When the metal layer 22 is provided, the sum of the film thickness of the metal layer 17, the free layer 18 and the metal layer 22 is desired to be in the range where stress control by the thin film insertion layer 19 is effectively obtained. When the sum of the film thickness of the metal layer 17, the free layer 18 and the metal layer 22 is too large, it becomes difficult to make the stress change of the spin-dependent scattering unit of the spacer layer 16 to the free layer 18 gradual. This is because the stress control action of the thin film insertion layer 19 is hardly exerted to an area in the vicinity of the CCP-NOL spacer layer 16. Therefore, the sum of the film thickness of the metal layer 17, the free layer 18 and the metal layer 22 is desirably 10 nm or less and is more desirably 5 nm or less.

Cu [1 nm]/Ru [10 nm] is stacked on the thin film insertion layer 19 as the cap layer 20. The cap layer 20 has the function of protecting the spin-valve film. The film thickness of the Cu layer is preferably about 0.5 to 10 nm. An Ru layer may be directly provided on the free layer 18 with a thickness of about 0.5 to 10 nm without providing the Cu layer. Another metal layer may be provided on the Cu layer instead of the Ru layer. The composition of the cap layer 20 is not especially limited, and the other materials may be used if only they can exhibit the cap effect. The upper electrode 21 for perpendicularly passing a current to the spin-valve film is formed on the cap layer 20.

When the CCP-CPP element properties of this example were evaluated, in the case of using any oxide material of $Al_2O_3$, $SiO_2$, MgO, ZnO and $Ta_2O_5$ as the thin film insertion layer 19, reduction in MR deterioration by current energization for a long time was confirmed as compared with the case where the thin film insertion layer 19 was not inserted.

Example 2

In this example, the magnetoresistive effect element having the stacked structure shown in FIG. 1 was produced.
Lower electrode 11
Foundation layer 12: Ta [5 nm]/Ru [2 nm]
Pinning layer 13: $Pt_{50}Mn_{50}$ [15 nm]
Pinned layer 14: $Co_{90}Fe_{10}$ [3.6 nm]/Ru [0.9 nm]/{$(Fe_{50}Co_{50}$ [1 nm]/Cu [0.25 nm])×2/$Fe_{50}Co_{50}$ [1 nm]}
Metal layer 15: Cu [0.5 nm]
Spacer layer 16: $TiO_2$ insulating layer 161 and Cu current path 162
Metal layer 17: Cu [0.25 nm]
Free layer 18: $Co_{90}Fe_{10}$ [1 nm]/$Ni_{83}Fe_{17}$ [3.5 nm]
Thin film insertion layer 19: oxide material written in Table 2
Cap layer 20: Cu [1 nm]/Ta [5 nm]

The structure of example 2 differs from the structure of example 1 in the material of the CCP-NOL spacer layer 16 and the material of the thin film insertion layer 19. When $TiO_2$ having tensile stress is used as the insulating layer material of the CCP-NOL spacer layer 16, the materials written in Table 2 having the same tensile stress as the spacer layer 16 can be used as the thin film insertion layer 19. In this example, $TiO_2$ was used as the thin film insertion layer 19.

When the CCP-CPP element characteristics of this example were evaluated, by using $TiO_2$ as the thin film insertion layer 19, reduction in MR deterioration by current energization for a long time was confirmed as compared with the case where the thin film insertion layer 19 was not inserted.

Example 3

In this example, the magnetoresistive effect element having the stacked structure shown in FIG. 7 was produced.
Lower electrode 11
Foundation layer 12: Ta [5 nm]/Ru [2 nm]
Pinning layer 13: $Pt_{50}Mn_{50}$ [15 nm]
Pinned layer 14: $Co_{90}Fe_{10}$ [3.6 nm]/Ru [0.9 nm]/{$(Fe_{50}CO_{50}$ [1 nm]/Cu [0.25 nm])×2/$Fe_{50}Co_{50}$ [1 nm]}
Metal layer 15: Cu [0.5 nm]
Spacer layer 16: $Al_2O_3$ insulating layer 161 and Cu current path 162 [1.5 nm]
Metal layer 17: Cu [0.25 nm]
Free layer 18: $Co_{90}Fe_{10}$ [1 nm]/$Ni_{83}Fe_{17}$ [3.5 nm]
Metal layer 23: Cu [1 nm]
Thin film insertion layer 19: the insulating layer 191 composed of an oxide material having compression stress written in Table 1 and Cu current path 192 [0.5 to 2.0 nm]
Cap layer 20: Cu [1 nm]/Ta [5 nm]

The structure of example 3 differs from the structure of example 1 in addition of the metal layer 23, and the film structure of the thin film insertion layer 19A. The film structure of the thin film insertion layer 19A is the CCP-NOL structure, and has the insulating layer 191 and the current path 192. The metal layer 23 is used for formation of the current path 192, and is a so-called supply source of the current path 192. However, the metal layer 23 does not have to remain as the definite metal layer after formation of the current path 192.

The thin film insertion layer 19A of the CCP-NOL structure can be produced as follows. The metal layer 22 was formed on the free layer 18. The metal layer 22 is the layer to be the supply source of the thin film insertion layer 19A and the current path 192, and is composed of Cu, Ag or Au. The metal layer to be oxidized was formed on the metal layer 23. The metal layer to be oxidized is the layer which is converted into the oxide layer (insulating layer 191) of the thin film insertion layer 19A, and includes at least one kind of element selected from a group constituted of Al, Si, Mg, Ti, Ta and Zn. Ion beam of a rare gas (for example, Ar), or RF plasma was irradiated to the surface of the metal layer to be oxidized. The pretreatment is called a PIT (Pre-ion treatment) process step. As a result of the PIT process step, part of the metal layer 23 was sucked up and entered the metal layer to be oxidized.

The metal layer to be oxidized was to be oxidized. More specifically, the metal layer to be oxidized was converted into an oxide layer by supplying the oxidizing gas (for example, $O_2$) while ion beam of a rare gas (for example, Ar), or RF plasma is irradiated. By the oxidation treatment (IAO: Ion beam-assisted Oxidation)), the thin film insertion layer 19A of the CCP-NOL structure in which the current path 192 of Cu or the like penetrates through the oxide material (insulating layer 191) in the stacking direction was produced.

When the CCP-CPP element characteristics of this example were evaluated, in the case of using any oxide material of $Al_2O_3$, $SiO_2$, MgO, ZnO and $Ta_2O_5$ as the insulating layer 191 of the thin film insertion layer 19A, reduction in MR rate of change by current energization for a long time was confirmed as compared with the case where the thin film insertion layer 19 was not inserted.

Example 4

In this example, the magnetoresistive effect element having the stacked structure shown in FIG. 7 was produced.
Lower electrode 11
Foundation layer 12: Ta [5 nm]/Ru [2 nm]
Pinning layer 13: $Pt_{50}Mn_{50}$ [15 nm]
Pinned layer 14: $Co_{90}Fe_{10}$ [3.6 nm]/Ru [0.9 nm]/{$(Fe_{50}Co_{50}$ [1 nm]/Cu [0.25 nm])×2/$Fe_{50}Co_{50}$ [1 nm]}
Metal layer 15: Cu [0.5 nm]
Spacer layer 16: $TiO_2$ insulating layer 161 and Cu current path 162 [1.5 nm]
Metal layer 17: Cu [0.25 nm]
Free layer 18: $Co_{90}Fe_{10}$ [1 nm]/$Ni_{83}Fe_{17}$ [3.5 nm]
Metal layer 23: Cu [1 nm]
Thin film insertion layer 19A: the insulating layer 191 composed of an oxide material having compression stress written in Table 2 and Cu current path 192 [0.5 to 2.0 nm]
Cap layer 20: Cu [1 nm]/Ta [5 nm]

The structure of the example 4 differs from the structure of example 3 in material of the CCP-NOL spacer layer 16 and the material of the thin film insertion layer 19. When $TiO_2$ having tensile stress is used as the insulating material of the CCP-NOL spacer layer 16, the material written in Table 2 having the same tensile stress as the spacer layer 16 can be sued as the insulating layer 191 of the thin film insertion layer 19A. In this example, $TiO_2$ was used as the insulating layer 191 of the thin film insertion layer 19A.

When the CCP-CPP element characteristics of this example were evaluated, by using $TiO_2$ as the insulating layer 191 of the thin film insertion layer 19A, reduction in MR deterioration by current energization for a long time was confirmed as compared with the case where the thin film insertion layer 19A was not inserted.

(Application of the Magnetoresistive Effect Element)

Hereinafter, application of the magnetoresistive effect element (CCP-CPP element) according to the embodiment of the present invention will be described.

(Magnetic Head)

Figure 9:
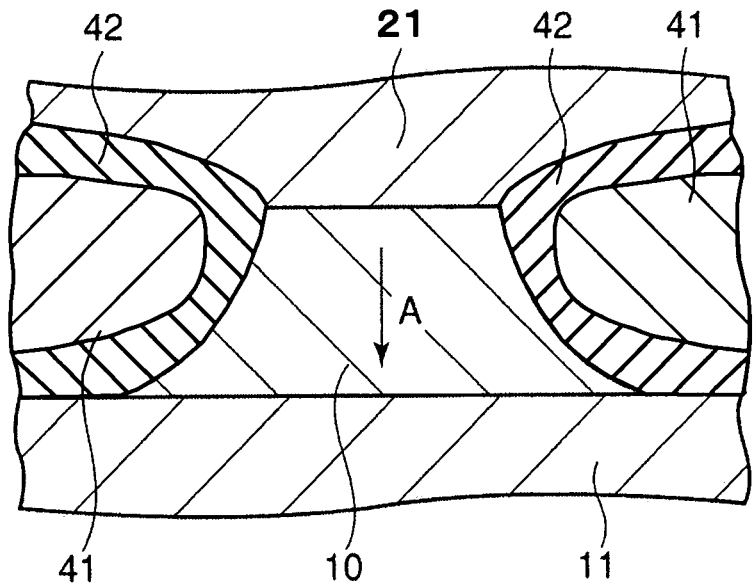
FIG. 9 is a view showing a state in which the magnetoresistive effect element according to the embodiments is incorporated into a magnetic head.
Figure 10:
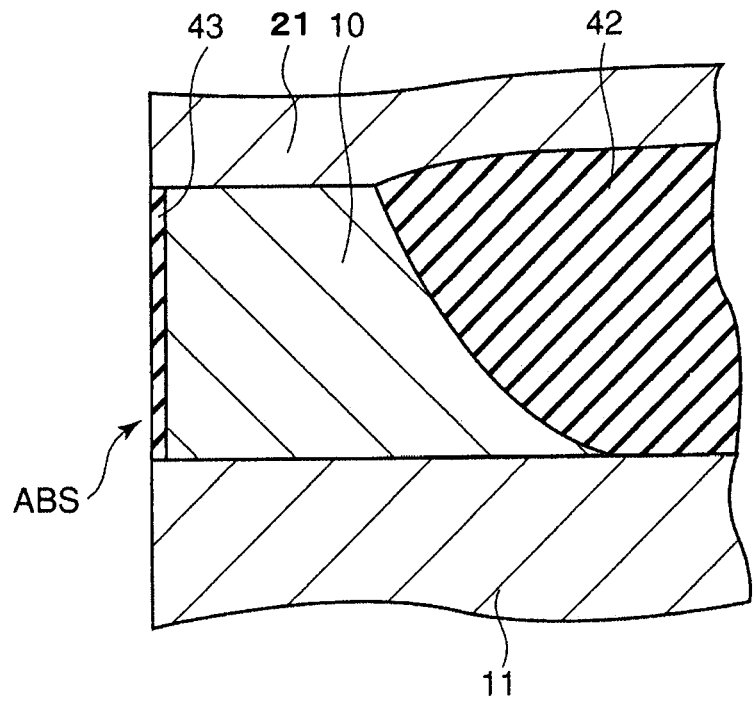
FIG. 10 is a view showing a state in which the magnetoresistive effect element according to the embodiments is incorporated into a magnetic head.

FIG. 9 and FIG. 10 show a state in which the magnetoresistive effect element according to the embodiments is incorporated into a magnetic head. FIG. 9 is a sectional view of the magnetoresistive effect element cut in the direction substantially parallel with a medium opposing surface opposed to a magnetic recording medium (not shown). FIG. 10 is a sectional view of the magnetoresistive effect element cut in the direction perpendicular to a medium opposing surface ABS.

The magnetic head shown as an example in FIGS. 9 and 10 has a so-called hard abutted structure. The magnetoresistive effect film 10 is the above described CCP-CPP film. The lower electrode 11 and the upper electrode 21 are respectively provided under and on the magnetoresistive effect film 10. In FIG. 9, on both side surfaces of the magnetoresistive effect film 10, a bias magnetic field-applying film 41 and an insulating film 42 are stacked and provided. As shown in FIG. 10, a protection layer 43 is provided on the medium opposing surface of the magnetoresistive effect film 10.

A sense current to the magnetoresistive effect film 10 is passed in the direction substantially perpendicular to the film plane as shown by the arrow A by the lower electrode 11 and the upper electrode 21 disposed under and on it. A bias magnetic field is applied to the magnetoresistive effect film 10 by a pair of bias magnetic field-applying films 41 and 41 provided at the left and the right. By controlling magnetic anisotropy of the free layer 18 of the magnetoresistive effect film 10 to make it a single magnetic domain by the bias magnetic field, the magnetic domain structure is stabilized and Barkhausen noise accompanying displacement of the magnetic domain wall can be controlled.

The S/N ratio of the magnetoresistive effect film 10 is enhanced, and therefore, when applied to a magnetic head, magnetic reproduction with high sensitivity is possible.

(Hard Disk and Head Gimbal Assembly)

The magnetic head shown in FIGS. 9 and 10 can be loaded on a magnetic recording/reproducing device by being incorporated into a recording/reproducing integrated type magnetic head assembly.

Figure 11:
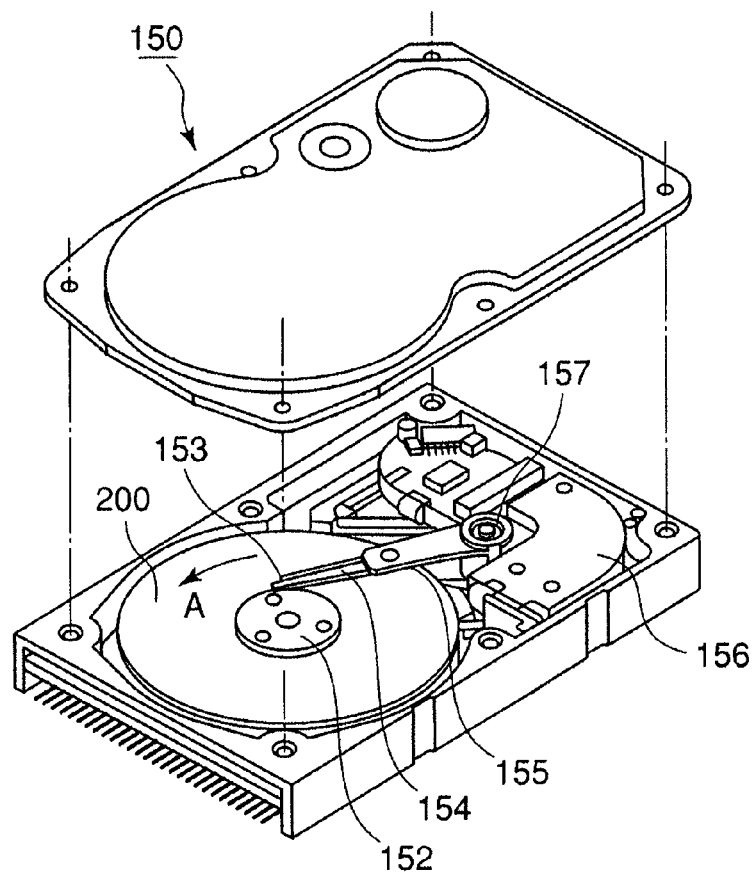
FIG. 11 is a perspective view of a main part showing a schematic construction of a magnetic recording/reproducing apparatus as an example.

FIG. 11 is a perspective view of a main part showing a schematic construction of such a magnetic recording/reproducing device. Namely, a magnetic recording/reproducing device 150 is a device of a type using a rotary actuator. In the drawing, a magnetic disk 200 is fitted to a spindle 152, and is rotated in the direction of the arrow A by a motor not shown which responds to a control signal from the drive device control part not shown. The magnetic recording/reproducing device 150 may include a plurality of magnetic disks 200.

A head slider 153 which performs recording and reproducing of information stored in the magnetic disk 200 is mounted to a tip end of a suspension 154. The head slider 153 is loaded with a magnetic head including the magnetoresistive effect element according to any of the above described embodiments in the vicinity of its tip end.

When the magnetic disk 200 rotates, the medium-facing surface (ABS) of the head slider 153 is held with a predetermined floating amount from the surface of the magnetic disk 200. Alternatively, a so-called "contact-traveling type" in which the slider is in contact with the magnetic disk 200 may be adopted.

The suspension 154 is connected to one end of an actuator arm 155. A voice coil motor 156 which is a kind of a linear motor is provided at the other end of the actuator arm 155. The voice coil motor 156 is constructed by a drive coil not shown wounded on a bobbin part, and a magnetic circuit constituted of a permanent magnet and a counter yoke disposed to oppose to each other to sandwich the coil.

The actuator arm 155 is held by ball bearings not shown which are provided at two upper and lower spots of a pivot 157 so as to be able to rotationally slide by the voice coil motor 156.

Figure 12:
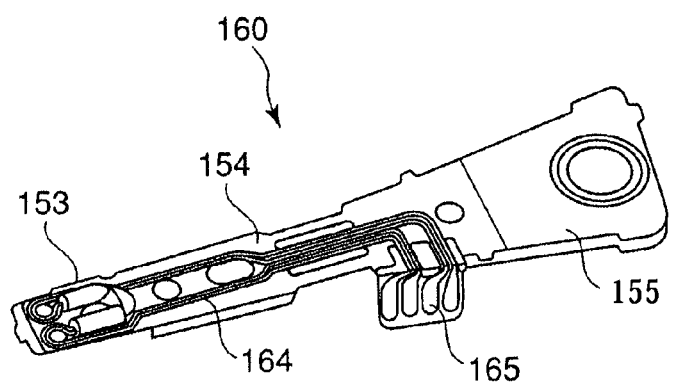
FIG. 12 is an enlarged perspective view of a head gimbal assembly at a tip end from an actuator arm seen from a disk side.

FIG. 12 is an enlarged perspective view of a head gimbal assembly at the tip end from the actuator arm 155 seen from the disk side. Namely, an assembly 160 has the actuator arm 155, and the suspension 154 is connected to one end of the actuator arm 155. The head slider 153 including the magnetic head including the magnetoresistive effect element according to any one of the above described embodiments is mounted to the tip end of the suspension 154. The suspension 154 has a lead wire 164 for writing and reading a signal, and the lead wire 164 and each electrode of the magnetic head incorporated into the head slider 153 are electrically connected. Reference numeral 165 in the drawing denotes an electrode pad of the assembly 160.

According to the present embodiments, by including the magnetic head including the above described magnetoresistive effect element, information magnetically recorded in the magnetic disk 200 with high recording density can be reliably read.

(Magnetic Memory)

Next, a magnetic memory loaded with the magnetoresistive effect element according to the embodiments will be described. Namely, a magnetic memory such as a magnetic random access memory (MRAM) according to the embodiments can be realized.

Figure 13:
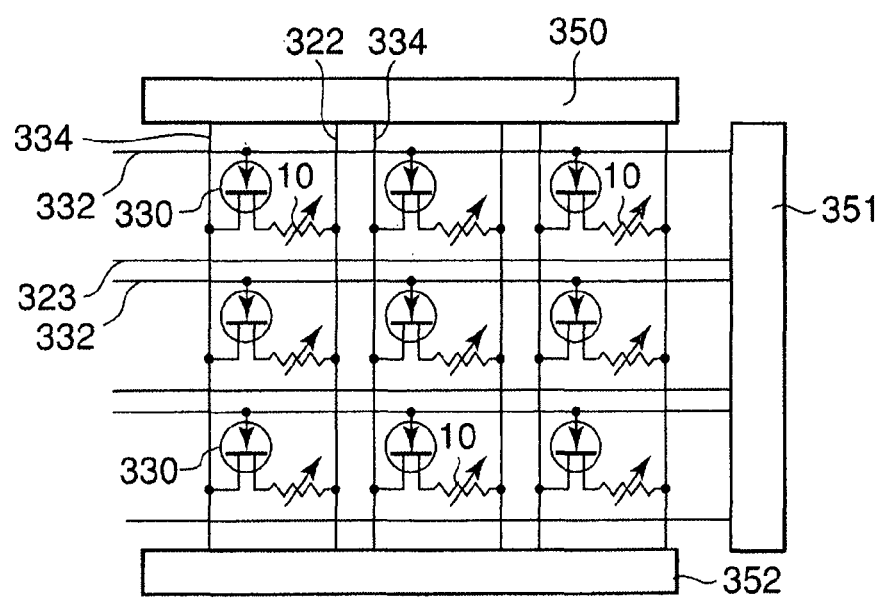
FIG. 13 is a view showing one example of a matrix configuration of a magnetic memory according to the embodiments.
Figure 15:
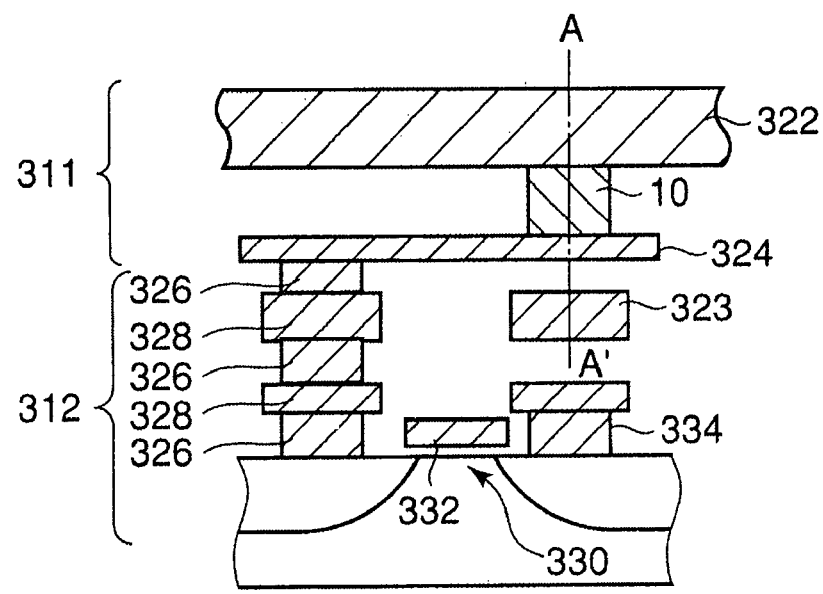
FIG. 15 is a sectional view showing a main part of the magnetic memory according to the embodiments.

FIG. 13 is a view showing one example of a matrix configuration of the magnetic memory according to the embodiments. FIG. 15 shows a circuit configuration when memory cells are disposed in an array shape. In order to select 1 bit in the array, a column decoder 350 and a row decoder 351 are included, a switching transistor 330 is turned on by a bit line 334 and a word line 332 and the one bit is uniquely selected, and by detecting it with the sense amplifier 352, the bit information recorded in the magnetic recording layer (free layer) in the magnetoresistive effect film 10 can be read. When the bit information is written, a write current is passed to the specific write word line 323 and bit line 322, and the generated magnetic field is applied.

Figure 14:
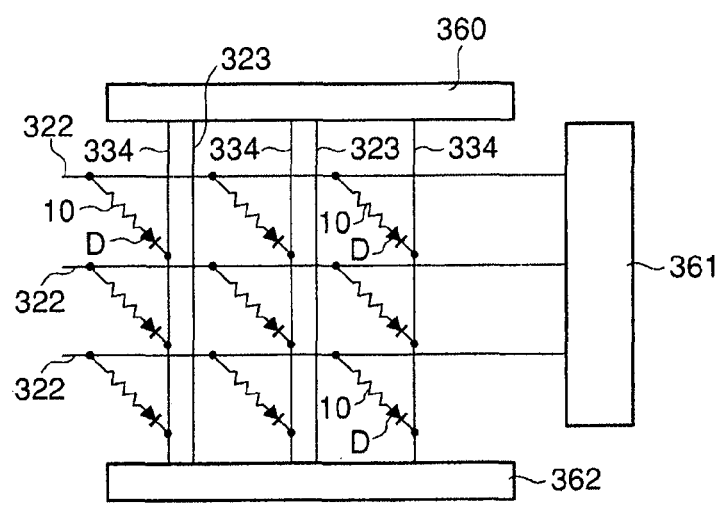
FIG. 14 is a view showing another example of the matrix configuration of the magnetic memory according to the embodiments.

FIG. 14 is a view showing another example of the matrix configuration of the magnetic memory according to the embodiments. In this case, the bit line 322 and the word line 334 which are arranged in a matrix shape are respectively selected by the decoders 360 and 361, and the specific memory cell in the array is selected. Each memory cell has the structure in which the magnetoresistive effect element 10 and a diode D are connected in series. Here, the diode D has the function of preventing a sense current from making a detour in the selected memory cell other than the magnetoresistive effect element 10. Write is performed by the magnetic field generated by passing a write current to the specific bit line 322 and write word line 323, respectively.

Figure 16:
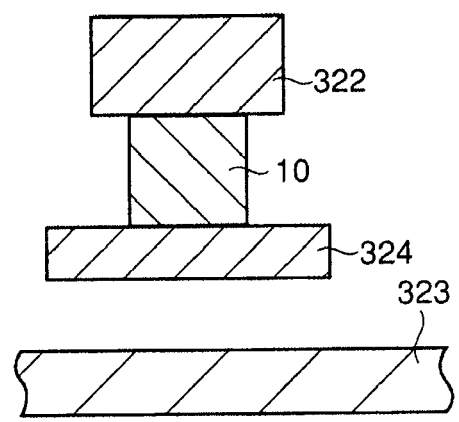
FIG. 16 is a sectional view taken along the A-A' line of FIG. 15.

FIG. 15 is a sectional view showing a main part of a magnetic memory according to the embodiments. FIG. 16 is a sectional view taken along the A-A' line of FIG. 15. The structure shown in these drawings corresponds to the memory cell of 1 bit included in the magnetic memory shown in FIG. 13 or FIG. 14. The memory cell has a memory element part 311 and an address selecting transistor part 312.

The memory element part 311 has the magnetoresistive effect element 10, and a pair of wirings 322 and 324 connected to this. The magnetoresistive effect element 10 is the magnetoresistive effect element (CCP-CPP element) according to the above described embodiments.

Meanwhile, the address selecting transistor part 312 is provided with a transistor 330 connected via a via 326 and a buried wiring 328. The transistor 330 performs a switching operation in accordance with the voltage applied to a gate 332, and controls opening and closing of a current path of the magnetoresistive effect element 10 and a wiring 334.

Below the magnetoresistive effect element 10, the write wiring 323 is provided in the direction substantially perpendicular to the wiring 322. These write wirings 322 and 323 can be formed of, for example, aluminum (Al), copper (Cu), tungsten (W), tantalum (Ta) or an alloy including any one of them.

In the memory cell with such a composition, when the bit information is written into the magnetoresistive effect element 10, a write pulse current is passed to the wirings 322 and 323, and by applying the synthetic magnetic field induced by the currents, magnetization of the recording layer of the magnetoresistive effect element is properly inverted.

When the bit information is read out, a sense current is passed through the wiring 322, the magnetoresistive effect element 10 including the magnetic recording layer, and a lower electrode 324, and the resistance value or the change in the resistance value of the magneto-resistive effect element 10 is measured.

The magnetic memory according to the embodiments reliably controls the magnetic domain of the recording layer and can ensure reliable write and can reliably perform reading by using the magnetoresistive effect element (CCP-CPP element) according to the above described embodiments, even if the cell size is miniaturized.

Recently, instead of the writing method by the current magnetic field as described above, a writing method utilizing spin injection magnetization reversal is proposed. The spin injection magnetization reversal write is a method for performing write by passing currents with the direction of spin aligned to the magnetoresistive effect element 10. In a magnetic memory of the spin injection magnetization reversal write method, the magnetoresistive effect element (CCP-CPP element) according to the above described embodiment can be used. By doing so, even if the cell size is miniaturized, the magnetic domain of the recording layer is reliably controlled to be able to ensure reliable write, and reading can be performed reliably.

Figure 17:
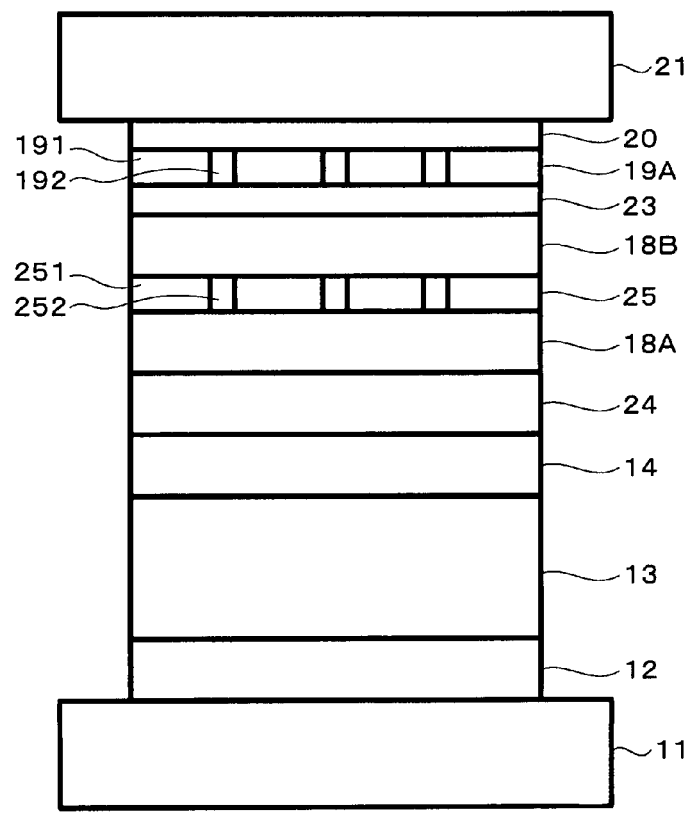
FIG. 17 is a sectional view showing a section of a tunnel magnetoresistive effect element having a current confining layer in a free layer according to the embodiments.

As the magnetoresistive effective element 10 for use in MRAM, the example having the stacked structure shown in FIG. 17 can be carried out.

Foundation layer 12: Ta [5 nm]/Ru [2 nm]
Pining layer 13: $Pt_{50}Mn_{50}$ [15 nm]
Pinned layer 14: $Co_{90}Fe_{10}$ [3.4 nm]/Ru [0.9 nm]/$(Co_{80}Fe_{20})B_{10}$ [3.5 nm]
Tunnel insulating layer 24: MgO [1.5 nm]
Lower free layer 18A: $CO_{90}Fe_{10}$ [1 nm]/$Ni_{83}Fe_{17}$ [1 nm]
Current confining layer 25: CCP-NOL [1.0 nm] of $Al_2O_3$ insulating layer and an NiFe current path
Upper free layer 18B: NiFe [2.5 nm]
Metal layer 23: Cu [0.5 nm]
Thin film insertion layer 19A: CCP-NOL [0.5 to 2.0 nm] of the insulating layer composed of an oxide material having compression stress written in Table 1 and Cu current path
Cap layer 20: Cu [1 nm]/Ta [5 nm]

In use in MRAM, it is proposed that the magnetoresistive effect is realized by a tunnel element, and the CCP structure is used for enhancing switching technique of MRAM, and the like (H. Meng and J-P. Wang, IEEE Trans Magn. 41 (10), 2612 (2005)).

In this case, it is necessary to provide CCP-NOL as the current confining layer 25 inside the free layer. At this time, migration of atoms with heat generation in the vicinity of CCP-NOL by current energization and internal stress in the vicinity of CCP-NOL as the drive force occurs. In this case, distribution of stress is large in the vicinity of CCP-NOL, and therefore, distribution also occurs to the migration length of the atoms. As a result, there is the possibility of occurrence of lattice mismatch, mixing of atoms and increase in roughness in the interface with the metal layer adjacent to MgO that is a crystalline oxide or inside the metal layer. These phenomena become the cause of reduction in the TMR effect.

In this case, as in the above described embodiments, the thin film insertion layer (material especially having stress of the same polarity as the internal stress peculiar to the material of the current confining layer 25 inside the free layer) is interposed on the free layer, and thereby, reduction in the TMR effect can be prevented. In this example, the material of the current confining layer 25 in the free layer is $Al_2O_3$ having compression stress, and therefore, as the material of the insulating layer 191 of the thin film insertion layer 19A, an oxide material written in Table 1 having the same compression stress can be used.

When CCP-NOL layer is inserted into the inside of the free layer as the current confining layer 25, Ni, Co, Fe and alloy material of them are desirably used instead of Cu for the metal to be the current path. This is because it is preferable that the upper and lower magnetic layers are strongly coupled with each other magnetically via the CCP-NOL.

As the formation process for realizing the CCP-NOL inserted into the free layer, it is desirable to perform the above described PIT/IAO treatment. In this case, as the material for forming the current path, it is possible to use the composing material of the free layer directly.

The value of the area resistance RA of the tunnel magnetoresistive effect element of this example is substantially determined by the tunnel insulating layer of MgO, and is 1.5 to $1\times10^3$ $\Omega\mu m^2$. The RA value of the tunnel element of this example is large as compared with the area resistance value RA, 500 m$\Omega\mu m^2$ of the CCP-CPP element of the example 1. Accordingly, when the same voltage as in the example 1 is applied, the sense current of the element is smaller than the case of the example 1. Therefore, heat generation by sense current energization is smaller than the CCP-CPP element in the example 1.

However, in such a case, not a few phenomena which reduce the TMR effect as described above can occur. In the tunnel magnetoresistive effect element of this example, by insertion of the thin film insertion layer 19A, prevention of the phenomena which causes reduction in the above described TMR effect can be expected.

Figure 18:
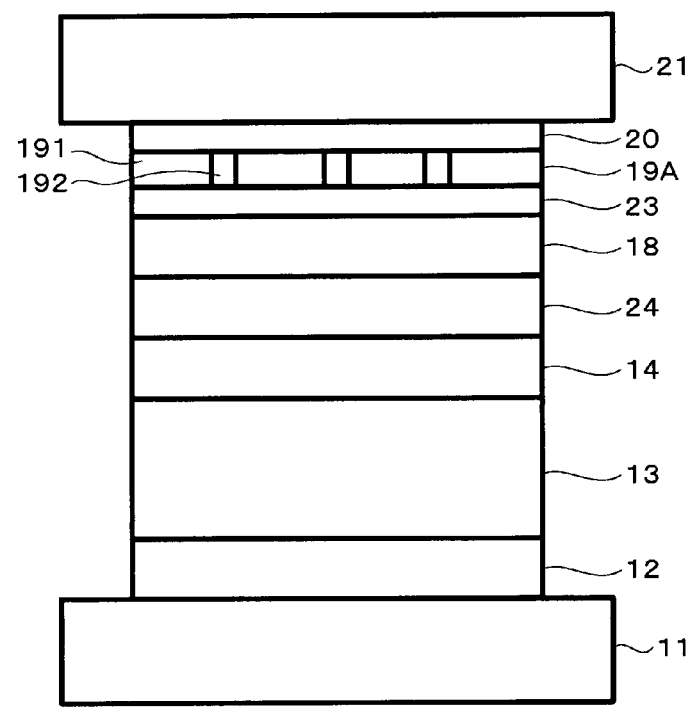
FIG. 18 is a sectional view showing a section of the tunnel magnetoresistive effect element according to the embodiments.

As the magnetoresistive effect film 10 for use in MRAM, an example having the stacked structure shown in FIG. 18 can be carried out.

Foundation layer 12: Ta [5 nm]/Ru [2 nm]
Pining layer 13: $Pt_{50}Mn_{50}$ [15 nm]
Pinned layer 14: $Co_{90}Fe_{10}$ [3.4 nm]/Ru [0.9 nm]/$(Co_{80}Fe_{20})B_{10}$ [3.5 nm]
Tunnel insulating layer 24: MgO [1.5 nm]
Free layer 18: $CO_{90}Fe_{10}$ [1 nm]) $Ni_{83}Fe_{17}$ [3.5 nm]
Metal layer 23: Cu [0.5 nm]
Thin film insertion layer 19A: CCP-NOL [0.5 to 2.0 nm] of the insulating layer composed of an oxide material having compression stress written in Table 1 and Cu current path
Cap layer 20: Cu [1 nm]/Ta [5 nm]

In this example for use in MRAM, the magnetoresistive effect is realized by a tunnel element. In the case of the tunnel element, heat generation occurs in the vicinity of the tunnel insulating layer, though the heat generation is not as large as the Joule heat of the CCP-NOL. Therefore, migration of atoms with heat generation and internal stress as the drive force occurs.

In this case, the area in the vicinity of MgO which is used as the tunnel insulating layer 24 is in an unstable state with large distribution of stress. In the area in the vicinity of MgO, distribution of stress is large, and therefore, distribution also occurs to the migration length of the atoms. As a result, there is the possibility of occurrence of lattice mismatch, mixing of atoms and increase in roughness in the interface with the metal layer adjacent to MgO that is a crystalline oxide of the tunnel insulating film as the spacer layer or inside the metal layer. These phenomena become the cause of reduction in the TMR effect.

In this case, as in the above described embodiments, the thin film insertion layer (material especially having stress of the same polarity as the internal stress peculiar to the material of the tunnel insulating layer 24) is interposed on the free layer, and thereby, reduction in the TMR effect can be prevented. In this example, the material of the tunnel insulating layer 24 is MgO having compression stress. Therefore, as the material of the insulating layer 191 of the thin film insertion layer 19A, an oxide material written in Table 1 having the same compression stress can be used.

The value of the area resistance RA of the tunnel magnetoresistive effect element of this example is substantially determined by the tunnel insulating layer of MgO, and is 1.5 to $1\times10^3$ $\Omega\mu m^2$. The RA value of the tunnel element of this example is large as compared with the area resistance value RA, 500 m$\Omega\mu m^2$ of the CCP-CPP element of the example 1. Accordingly, when the same voltage as in the example 1 is applied, the sense current of the element is smaller than the case of the example 1. Therefore, heat generation by sense current energization is smaller than the CCP-CPP element in the example 1.

However, in such a case, not a few phenomena which reduce the TMR effect as described above can occur. In the tunnel magnetoresistive effect element of this example, by insertion of the thin film insertion layer 19A, prevention of the phenomena which cause reduction in the above described TMR effect can be expected.

Other Embodiments

The embodiment of the present invention is not limited to the above described embodiments, and can be enlarged and changed, and the enlarged and changed-embodiments are included in the technical scope of the present invention.

With regard to the concrete structure of the magnetoresistive effect film, and the shapes and materials of the electrodes, bias applying film, insulating film and the like other than that, those skilled in the art can similarly carry out the present invention by properly selecting them from the known range and can obtain the similar effect.

For example, on application of the magnetoresistive effect element to a reproducing magnetic head, detection resolution of the magnetic head can be specified by applying magnetic shields to the top and bottom of the element.

The embodiments of the present invention can be applied to magnetic heads or magnetic reproducing apparatuses of not only a longitudinal magnetic recording method, but also a vertical magnetic recording method.

Further, the magnetic recording/reproducing apparatus of the present invention may be a so-called fixed type which steadily includes a specific recording medium, and may be a so-called "removable" type in which the recording medium is replaceable.

Moreover, all the magnetoresistive effect elements, magnetic heads, magnetic recording/reproducing apparatuses which can be carried out by those skilled in the art by properly changing the designs based on the magnetic head and the magnetic recording/reproducing apparatus described above as the embodiments of the present invention are also included in the scope of the present invention.

What is claimed is:

1. A magnetoresistive effect element, comprising:
   a fixed magnetization layer of which magnetization direction is practically fixed in one direction;
   a free magnetization layer of which magnetization direction changes with respect to an external magnetic field;
   a nonmagnetic spacer layer that is disposed between the fixed magnetization layer and the free magnetization layer, and includes a first insulating layer, and a first current path which penetrates through the first insulating layer; and
   an insertion layer which is disposed on an opposite side of the free magnetization layer from the nonmagnetic spacer layer,
   wherein the first insulating layer has an oxide, a nitride, or an oxynitride including at least one kind of element selected from a group constituted of Al (aluminum), Si (silicon), Mg (magnesium), Ta (tantalum) and Zn (zinc) as a major constituent, and
   the insertion layer has an oxide, a nitride, or an oxynitride including at least one kind of element selected from a group constituted of Al (aluminum), Si (silicon), Mg (magnesium), Ta (tantalum) and Zn (zinc) as a major constituent.

2. The magnetoresistive effect element according to claim 1,
   wherein the first insulating layer has a first stress and the insertion layer has a second stress of the same polarity as the first stress.

3. The magnetoresistive effect element according to claim 1,
   wherein the insertion layer has a second insulating layer having an oxide, a nitride or an oxynitride as a major constituent, and a second current path penetrating through the second insulating layer in a layer direction.

4. The magnetoresistive effect element according to claim 3,
   wherein the second current path has a metal including at least one kind of element selected from a group constituted of Cu (copper), Au (gold) and Ag (silver) as a major constituent.

5. The magnetoresistive effect element according to claim 3,
   wherein a density of the second current path is from 30 to 60% inclusive.

6. The magnetoresistive effect element according to claim 1, further comprising:
a metal layer which is disposed between the insertion layer and the free magnetization layer, and includes at least one kind of element selected from a group constituted of Ru (ruthenium), Cu (copper), Au (gold) and Ag (silver).

7. The magnetoresistive effect element according to claim 1,
wherein film thickness of the insertion layer is from 0.5 to 2.0 nm.

8. A magnetic head comprising the magnetoresistive effect element according to claim 1.

9. A magnetic recording/reproducing apparatus comprising the magnetoresistive effect element according to claim 1.

10. A magnetoresistive effect element, comprising:
a fixed magnetization layer of which magnetization direction is practically fixed in one direction;
a free magnetization layer of which magnetization direction changes with respect to an external magnetic field;
a nonmagnetic spacer layer that is disposed between the fixed magnetization layer and the free magnetization layer, and includes a first insulating layer, and a first current path which penetrates through the first insulating layer; and
an insertion layer which is disposed on an opposite side of the free magnetization layer from the nonmagnetic spacer layer,
wherein the first insulating layer has an oxide, a nitride, or an oxynitride, which includes Ti (titanium), as a major constituent, and
the insertion layer has an oxide, a nitride, or an oxynitride, which includes Ti (titanium), as a major constituent.

11. The magnetoresistive effect element according to claim 10,
wherein the insertion layer has a second insulating layer having an oxide, a nitride or an oxynitride as a major constituent, and a second current path penetrating through the second insulating layer in a layer direction.

12. The magnetoresistive effect element according to claim 10, further comprising:
a metal layer which is disposed between the insertion layer and the free magnetization layer, and includes at least one kind of element selected from a group constituted of Ru (ruthenium), Cu (copper), Au (gold) and Ag (silver).

13. A magnetic head comprising the magnetoresistive effect element according to claim 10.

14. A magnetic recording/reproducing apparatus comprising the magnetoresistive effect element according to claim 10.

15. A magnetoresistive effect element, comprising:
a fixed magnetization layer of which magnetization direction is practically fixed in one direction;
a free magnetization layer of which magnetization direction changes with respect to an external magnetic field;
a nonmagnetic insulating spacer layer that is disposed between the fixed magnetization layer and the free magnetization layer;
a current confining layer which is inserted into the free magnetization layer, and includes a first insulating layer, and a first current path penetrating through the first insulating layer; and
an insertion layer which is disposed on an opposite side of the free magnetization layer from the nonmagnetic insulating spacer layer,
wherein the first insulating layer has an oxide, a nitride, or an oxynitride including at least one kind of element selected from a group constituted of Al (aluminum), Si (silicon), Mg (magnesium), Ta (tantalum) and Zn (zinc), as a major constituent, and
the insertion layer has an oxide, a nitride, or an oxynitride including at least one kind of element selected from a group constituted of Al (aluminum), Si (silicon), Mg (magnesium), Ta (tantalum) and Zn (zinc), as a major constituent.

16. The magnetoresistive effect element according to claim 15,
wherein the first insulating layer has a first stress and the insertion layer has a second stress of the same polarity as the first stress.

17. The magnetoresistive effect element according to claim 15,
wherein the insertion layer has a second insulating layer having an oxide, a nitride or an oxynitride as a major constituent, and a second current path penetrating through the second insulating layer in a layer direction.

18. The magnetoresistive effect element according to claim 17,
wherein the second current path has a metal including at least one kind of element selected from a group constituted of Cu (copper), Au (gold) and Ag (silver) as a major constituent.

19. The magnetoresistive effect element according to claim 17,
wherein a density of the second current path is from 30 to 60% inclusive.

20. The magnetoresistive effect element according to claim 15, further comprising:
a metal layer which is disposed between the insertion layer and the free magnetization layer, and includes at least one kind of element selected from a group constituted of Ru (ruthenium), Cu (copper), Au (gold) and Ag (silver).

21. The magnetoresistive effect element according to claim 15,
wherein film thickness of the insertion layer is from 0.5 to 2.0 nm.

22. A magnetic recording/reproducing apparatus comprising the magnetoresistive effect element according to claim 15.

23. A magnetoresistive effect element, comprising:
a fixed magnetization layer of which magnetization direction is practically fixed in one direction;
a free magnetization layer of which magnetization direction changes with respect to an external magnetic field;
a nonmagnetic insulating spacer layer that is disposed between the fixed magnetization layer and the free magnetization layer;
a current confining layer which is inserted into the free magnetization layer, and includes a first insulating layer, and a first current path penetrating through the first insulating layer; and
an insertion layer which is disposed on an opposite side of the free magnetization layer from the nonmagnetic insulating spacer layer,
wherein the first insulating layer has an oxide, a nitride, or an oxynitride, which includes Ti (titanium), as a major constituent, and
the insertion layer has an oxide, a nitride, or an oxynitride, which includes Ti (titanium), as a major constituent.

24. The magnetoresistive effect element according to claim 23,
wherein the insertion layer has a second insulating layer having an oxide, a nitride or an oxynitride as a major constituent, and a second current path penetrating through the second insulating layer in a layer direction.

25. The magnetoresistive effect element according to claim 23,
wherein the second current path has a metal including at least one kind of element selected from a group constituted of Cu (copper), Au (gold) and Ag (silver) as a major constituent.

26. A magnetic recording/reproducing apparatus comprising the magnetoresistive effect element according to claim 23.

* * * * *